US012228600B2

(12) United States Patent
Almog et al.

(10) Patent No.: US 12,228,600 B2
(45) Date of Patent: Feb. 18, 2025

(54) SYSTEM AND METHOD FOR CHARACTERIZING PROPERTIES OF EM SIGNALS

(71) Applicant: ELTA SYSTEMS LTD., Ashdod (IL)

(72) Inventors: Benyamin Almog, Givat Brener (IL); Nadav Oxenfeld, Ramat Raziel (IL)

(73) Assignee: ELTA SYSTEMS LTD., Ashdod (IL)

( * ) Notice: Subject to any disclaimer, the term of this patent is extended or adjusted under 35 U.S.C. 154(b) by 590 days.

(21) Appl. No.: 17/423,033

(22) PCT Filed: Jan. 14, 2020

(86) PCT No.: PCT/IL2020/050054
§ 371 (c)(1),
(2) Date: Jul. 14, 2021

(87) PCT Pub. No.: WO2020/148752
PCT Pub. Date: Jul. 23, 2020

(65) Prior Publication Data
US 2022/0128611 A1    Apr. 28, 2022

(30) Foreign Application Priority Data
Jan. 16, 2019   (IL) .......................................... 264289

(51) Int. Cl.
G01R 29/08   (2006.01)
G01S 3/04    (2006.01)

(52) U.S. Cl.
CPC .......... G01R 29/0892 (2013.01); G01S 3/043 (2013.01)

(58) Field of Classification Search
CPC .............. G01R 29/0892; G01S 3/043
See application file for complete search history.

(56) References Cited

U.S. PATENT DOCUMENTS 5,248,958 A    9/1993  Milin
5,315,308 A *  5/1994  Nehorai ............... G01S 3/146
                                              342/448

(Continued)

FOREIGN PATENT DOCUMENTS

CN    106970348 A    7/2017
CN    107870314 A    4/2018
WO    2016053441 A2  4/2016

OTHER PUBLICATIONS

Chen G.-D. et al., DOA Estimation with Arrays of Electromagnetic Vector Sensors Under the Coexistence of Both Uncorrelated and Coherent Signals. Acta Electronica Sinica, Sep. 30, 2017, vol. 45, No. 9, pp. 2296-2301.

(Continued)

Primary Examiner — Mohamed Charioui
Assistant Examiner — Lynda Dinh
(74) Attorney, Agent, or Firm — FISHERBROYLES, LLP; Roger. L. Browdy; James E. Mrose

(57) ABSTRACT

A method and system are presented for determining properties of an electromagnetic waveform. The method comprises: providing measured parametric EM field data indicative of measured vector components of electric and magnetic fields of an EM waveform measured in at least one instance of time: providing reference data indicative of a plurality of reference data sets, each data set comprising: a reference steering vector parameters indicative of a certain respective direction of arrival (DO A), and a corresponding parametric EM field reference data including reference vector components of an electric and magnetic field pertaining to a wavefront propagating with the DO A of the corresponding reference steering vector parameters; determining a matching score between the measured parametric EM field data and the parametric EM field reference data of one or more of the reference data sets; and in case the matching score of (Continued)

a certain reference data set complies with a certain threshold condition, determining that said measured parametric EM field data corresponds to said EM waveform having a single EM wavefront thereby enabling to discriminate between measured EM waveforms having a single wavefront and measured EM waveforms having multiple wavefronts.

25 Claims, 7 Drawing Sheets

(56) References Cited

U.S. PATENT DOCUMENTS

| | | | |
|---|---|---|---|
| 6,407,702 B1 | 1/2002 | Bergman et al. | |
| 6,657,596 B2* | 12/2003 | Djuknic | G01R 29/10 343/753 |
| 8,686,913 B1* | 4/2014 | Schuman | G01S 3/143 342/438 |
| 9,041,400 B2 | 5/2015 | Almog et al. | |
| 9,541,370 B2* | 1/2017 | Almog | H01Q 21/24 |
| 10,928,498 B1* | 2/2021 | Li | H04W 64/00 |
| 2010/0265138 A1 | 10/2010 | Bem et al. | |
| 2018/0167102 A1 | 1/2018 | Ray | |
| 2018/0113194 A1 | 4/2018 | Huard et al. | |
| 2018/0156888 A1 | 6/2018 | Moshfeghi | |
| 2019/0103663 A1* | 4/2019 | Ichinose | H01Q 21/0037 |

OTHER PUBLICATIONS

Zhang Q. et al., Cyclostationarity-Based DOA and Polarization Estimation for Multipath Signals with a Uniform Linear Array of Electromagnetic Vector Sensors. 2006 International Conference on Machine Learning and Cybernetics, Aug. 16, 2006, pp. 2047-2052.

* cited by examiner

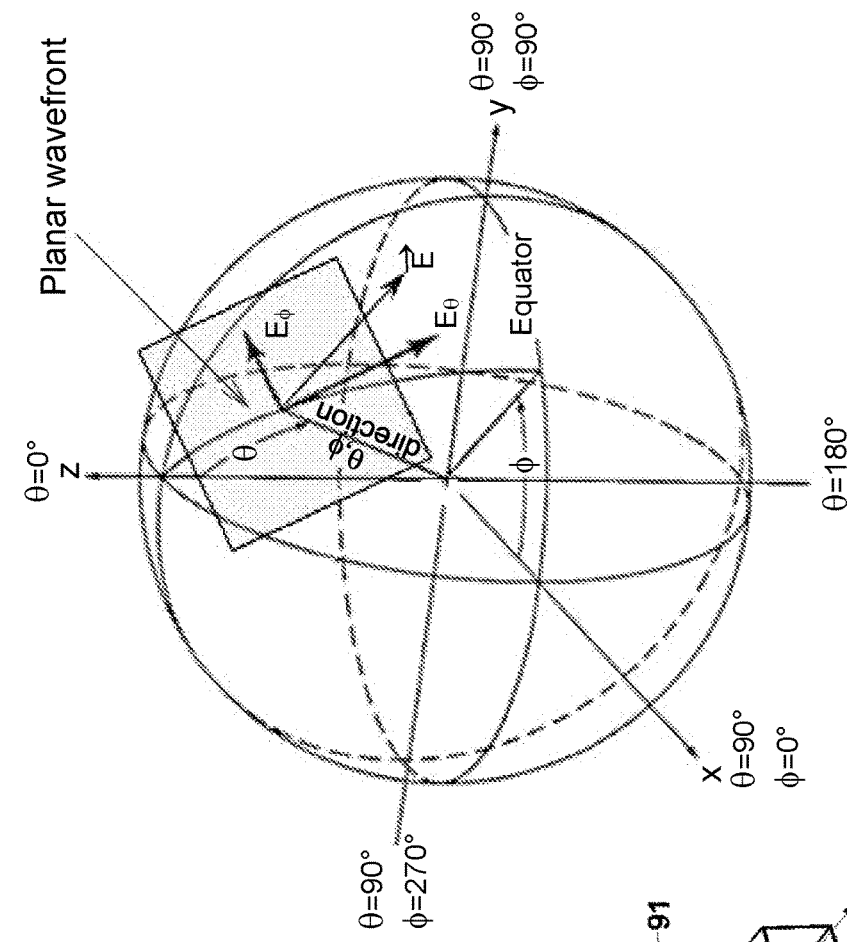
Fig. 1B
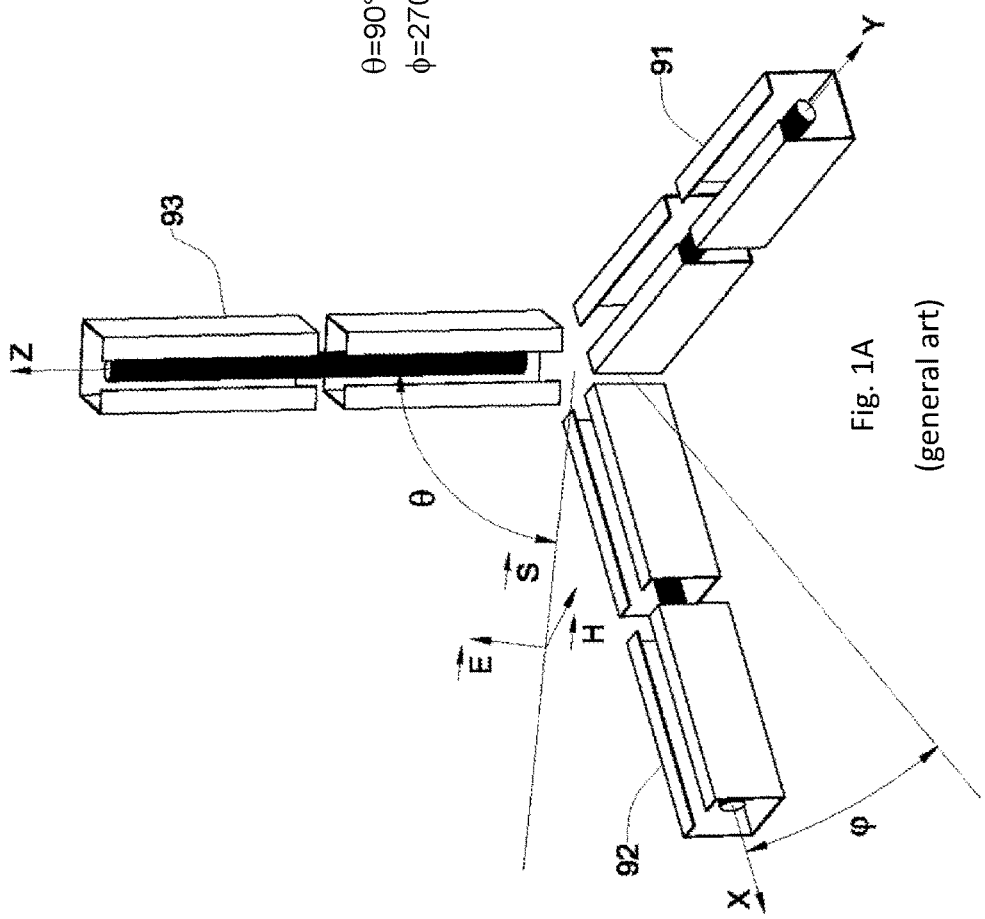
Fig. 1A (general art)

200 – A method for determining Interference conditions and DOA and/or SOP parameters

210 – Sub-Method for Measuring Parametric EM field data $\langle \vec{X} \rangle$: Measuring/providing parametric EM field data $\langle \vec{X} \rangle$ indicative of Measured amplitudes of vector components of electric and magnetic fields measured at a certain location in one or more time instances/frames;

212 – Obtaining the parametric EM field data $\vec{X}_{frm}(t)$ measured as a function of time during one or more time instance or one or more time-frames about such the one or more time instances respectively;

214 — The parametric EM field data $\langle \vec{X} \rangle$ being measured/obtained pertains to the vector components of electric and magnetic fields measured by a vector sensor (e.g. of a certain type) positioned at said certain location.

216 – Applying Preprocessing to the parametric EM field data $\vec{X}_{frm}(t)$ measured during the one or more time frames/instances.

216.2 - Providing frequency of interest $\omega_0$; and per each time frame determining the amplitudes of the vector components of the portions of the measured electric and magnetic fields oscillating at the frequency of interest $\omega_0$ – namely: $\vec{X}_{frm}(\omega_0)$;

For instance by converting the parametric EM field data $\vec{X}_{frm}(t)$ to frequency representation $\vec{X}_{frm}(\omega)$ (e.g. using Fourier Transform or similar transform) and extracting therefrom the amplitude $\vec{X}_{frm} = \vec{X}_{frm}(\omega_0)$ of the frequency of interest $\omega_0$

216.6 - Applying phase/time alignment to the parametric EM field data $\vec{X}_{frm}(t)$ of the time frames.

For instance by selecting one time frame as reference frame *rfrm* and applying time delay/shift to each of the other frames such that its parametric EM field data $\vec{X}_{rfrm}(t)$ has maximal correlation with the for which its correlation with the parametric EM field data $\vec{X}_{frm}(t)$ for the reference frame *rfrm*

218 – Averaging the parametric EM field data $\vec{X}_{frm}$ measured/obtained for the plurality of time frames/instances to obtained the parametric EM field data $\langle \vec{X} \rangle$ indicative of the measured amplitudes of vector components of electric and magnetic fields: $\langle \vec{X} \rangle = Average\ (\vec{X}_{frm})$

218.2 : $\langle \vec{X} \rangle \equiv \langle \vec{X} \rangle |_{\omega_n} = \langle \vec{X}_{frm}(\omega_0) \rangle_{frm}$

218.4 : $\langle \vec{X} \rangle \equiv \vec{X}_{frm}(t)$

218.6 : $\langle \vec{X} \rangle \equiv \langle \vec{X} \rangle(t) = \langle \vec{X}_{frm}(t) \rangle_{frm}$

219 –Normalizing the Electric field components and the Magnetic field components of $\langle \vec{X} \rangle$ such that: $\langle \vec{X} \rangle = [\hat{E}_x\ \hat{E}_y\ \hat{E}_z\ \hat{H}_x\ \hat{H}_y\ \hat{H}_z]$

Fig. 2B

Method 200 – (continued)

220 – Sub-Method for Providing Reference Data: Providing/computing reference data $REF = \{[\vec{A}_i, \vec{S}_i]\}$ including a plurality of reference data sets $REF = \{DS_i\}$. Each data set $DS_i$ includes: a reference steering parameters $\vec{S}_i$ indicative of at least a respective direction of arrival, $\vec{S}_i = [\theta_i, \phi_i]$, and a corresponding reference parametric EM field data $\vec{A}_i = [\hat{E}_x^i \ \hat{E}_y^i \ \hat{E}_z^i \ \hat{H}_x^i \ \hat{H}_y^i \ \hat{H}_z^i]$ presenting reference vector components of Electric and Magnetic fields as would be measured by a vector sensor (e.g. of a certain type) impinged by EM wavefront propagating with the parameters $\vec{S}_i$.

221 – Providing/computing the reference data $REF$, such that the reference parametric EM field data $\vec{A}_i$ of each reference data set $DS_i$, is normalized (e.g. by normalizing the vector components of the electric field and normalizing the vector components of the magnetic field)

222 – Providing/computing the reference data $REF = \{[\vec{A}_i, \vec{S}_i]\}$ such that the reference steering vectors' parameters $\vec{S}_i = [\theta_i, \phi_i, \gamma_i, \tau_i]$ of the data sets $DS_i$ also indicate the reference State of Polarization (SOP) parameters, $\gamma_i, \tau_i$, of the corresponding reference parametric EM field data $\vec{A}_i$.

223 – Providing/computing the reference data $REF$ such that the reference parametric EM field data $\vec{A}_i$ in each reference data set $DS_i$, presents a generalized vector of the sensing of an EM field waveform having the corresponding steering parameters $\vec{S}_i$ by the vector sensor.

223.1 – providing/computing the parametric EM field data $\vec{A}_i$ based on an analytic model $\vec{A} = [D_i][DOA_i][SOP_i]$ where $D_i$ may be a none unity response/distortion matrix $D_i$ characterizing the response and optionally EM distortions that are applied to the measurement of EM field waveform with steering parameters $\vec{S}_i$ by the vector sensor itself and/or by nearby objects (or D may be unity).

223.3 – Providing/computing the parametric EM field data $\vec{A}_i$ based on results of empirical measurements performed on the vector sensor (e.g. placed at a designated location of interest) to determine the response and optionally EM distortions that would be applied to the sensing of EM field waveform with steering parameters $\vec{S}_i$ by the vector sensor itself and/or by objects in its

224.2 –Providing/computing the parametric EM field data $\vec{A}_i$ such that the reference data sets $\{DS_i\}$ are spanned over the frequency domain and one or more reference data sets $\{DS_i\}$ pertain to the response of the vector sensor to a certain frequency $\omega$ such that: $[D_i] \rightarrow [D_{i,\omega}]$ ; $\vec{A}_i \rightarrow \vec{A}_{i,\omega}$

224.6 – Providing/computing the parametric EM field data $\vec{A}_i$ such that the reference data sets $\{DS_i\}$ are spanned over the time domain and one or more reference data sets $\{DS_i\}$ pertain to the response of the vector sensor to a certain temporal waveform shape $\delta$: $[D_i] \rightarrow [D_{i,\delta}]$ ; $\vec{A}_i \rightarrow \vec{A}_{i,\delta}(t)$

Fig. 2C

Method 200 – (continued)

230 - Determining matching scores $BF$ between the measured parametric EM field data $\langle \vec{X} \rangle$ and one or more reference parametric EM field data $\vec{A}_i$ of one or more of the reference data sets $\{DS_i\}$ and selecting candidate reference data sets $DS_i$ for representing the measured parametric EM field data $\langle \vec{X} \rangle$

- 231 – Providing one or more reference datasets for calculating their matching score with the measured parametric EM field data $\langle \vec{X} \rangle$
- 232 – Computing the matching score.
  - 232.2: $BF_i(\theta, \phi, \gamma, \tau) = \vec{A}_i^H \langle \vec{X} \rangle$
  - 232.4: $BF_i(\theta, \phi, \gamma, \tau) = \dfrac{\vec{A}_i^H \langle \vec{X} \rangle \langle \vec{X} \rangle^H \vec{A}_i}{\vec{A}^H \vec{A}}$
  - 232.6: $BF_i(\theta, \phi, \gamma, \tau) = Corr\left( \vec{A}_i^H(t), \langle \vec{X} \rangle (t + \Delta t) \right)$
- 234 – Providing threshold condition TH (e.g. predetermined/static condition or dynamically determined condition)
- 236 – Determining candidate datasets $\{DS_i\}$ representing the measured parametric EM filed based on the comparison between the matching scores $BF_i$ of the candidate datasets $\{DS_i\}$ with the threshold.

240 – Determining interference conditions exist and/or estimating the DOA and/or SOP of the measured parametric EM field data $\langle \vec{X} \rangle$

- 242 – In case no candidate datasets are found ->
  - 241 – filtering the candidates based on prior knowledge about SOP properties of the expected waveform.
  - 243 – optionally repeating method 200 for additional one or more times.
- 244 – In case single candidate datasets is found -> estimating that the steering vector params' of the dataset represents the DOA and/or SOP of the measured parametric EM field data $\langle \vec{X} \rangle$
- 246 – In case multiple candidate datasets are found -> Resolve which of the estimate that the steering vectors' params represents the DOA and/or SOP of the measured parametric EM field $\langle \vec{X} \rangle$

Fig. 2D

SYSTEM AND METHOD FOR CHARACTERIZING PROPERTIES OF EM SIGNALS

RELATED APPLICATIONS

This application is a U.S. National Phase Application under 35 U.S.C. 371 of International Application No. PCT/IL2020/050054, filed 14 Jan. 2020, which claims the benefit of priority of Israeli Patent Application No. 264289, filed 16 Jan. 2019.

TECHNOLOGICAL FIELD

The present invention is in the field of spatial analysis of received signals and particularly relates to spatial processing of electromagnetic waveform signals sensed by an electromagnetic (EM) vector sensor.

BACKGROUND

Electromagnetic vector sensors are devices capable of determining vector components of electromagnetic (EM) fields that are incident thereon. Generally, EM vector sensors include an arrangement of antenna elements configured and arranged (typically at a certain common point/location) for sensing vector components of an EM field relative to typically three, or at least two axes, which typically span three dimensions (3D), thus enabling measurement of the vector components of the EM field relative to 3D coordinate systems. Some known vector sensor techniques are further adapted to discriminate polarization of the sensed electromagnetic field sensed thereby (for example using magnetic and electric dipole antenna elements in each axis).

For example U.S. Pat. No. 6,407,702 discloses a method and system for obtaining direction of an electromagnetic wave. The method and system utilize the polarization properties of electromagnetic fields for a determination of the direction to the source of the electromagnetic radiation. The method and system primarily use a particular antenna device with its associated receiver means for obtaining a wave field measurement. Assuming separate frequencies, the method and system also make it possible to distinguish between several sources and register their separate polarizations simultaneously. At least three electric antennas, or three magnetic antennas, are used to measure the wave field. The registered field components need not be orthogonal to each other. The measured wave field is processed in accordance with predetermined formulae so that the propagation direction and other polarization characteristics, such as the spectral intensity I and the spectral degree of circular polarization, are derived. Furthermore, the measurements need not be from more than one point in space. In this respect a one-point measurement is considered to be such that all antennas are well within a sphere of a wavelength scale.

U.S. Pat. No. 9,041,400 co-assigned to the assignee of the present application, discloses an apparatus (e.g. a 3D direction finder) including two non-coinciding arrangements disposed in a two axes Cartesian coordinate system, such that each arrangement has a non-zero projection on a respective axis from among the two axes. Each one of the arrangements includes a pair of oppositely directed, spaced apart, co-axial radiating-capable elements, each of the elements being hollow with internal space, and being slotted throughout its entire extent. A first circuitry is coupled to the arrangement and is configured to sense an electric field projection along the axis and to convey it to a first feeding terminal. A second circuitry is coupled to a slot of the arrangement and is configured to sense a magnetic field's projection along said axis and to convey it to a first feeding terminal.

U.S. Pat. No. 8,686,913 discloses system that includes a sensor having a plurality of antenna elements arranged in a three-dimensional array. None of the plurality of antenna elements is configured as a loop antenna element. Each of the plurality of antenna elements is configured to provide a sensor output signal in response to an incident electromagnetic field having predetermined characteristics. A processing circuit is coupled to the sensor, the processing circuit being configured to obtain a directional vector to a source of the incident electromagnetic field from the plurality of sensor output signals. The sensor output signals correspond to a plurality of field components of the incident electromagnetic field at a point. The plurality of field components include differential values such that the plurality of field components provides at least nine (9) degrees of freedom (DOFs).

PCT patent application publication No. WO16053441 discloses an RF emitter sensing device comprising an antenna circuit and an estimator configured to output, for one or more incoming signals-of-interest (SoI), either or both of an estimated range to the emitter of each SoI, and estimates for one or more angles corresponding to the 3D angle-of-arrival (AoA) of each SoI, wherein: the antenna circuit has a plurality of ports that each output an output signal containing the one or more SoI, the antenna circuit including one or more multi-port antennas, each multi-port antenna having two or more ports, each multi-port antenna being configured to pick up a combination of one or more E-field signals and one or more H-field signals from each SoI, in a common volume of space.

U.S. Pat. No. 9,541,370 co-assigned to the assignee of the present application, discloses an apparatus (e.g. a 3D direction finding and polarization resolving device), including: an arrangement that includes at least one pair of oppositely directed, spaced apart, radiating-capable elements along a common axis, each of said elements being hollow with internal space, and being slotted throughout its entire extent; a first circuitry coupled to said arrangement and being configured to sense an electric field projection along said axis and to convey it to a first feeding terminal; and a second circuitry coupled to at least one slot of said arrangement configured to sense a magnetic field's projection along said axis and to convey it to a first feeding terminal. The apparatus is further configured to resolve a polarization vector of incoming wavefront propagating in an orthogonal direction to said common axis based on at least said sensed electric field projection and said magnetic field projection.

General Description

Accuracy geolocation techniques as well spectrum monitoring systems, such as time difference of arrival (TDOA) techniques, frequency difference of arrival (FDOA) techniques, direction finding (DF), direct position determination (DPD), and/or a combination of the above techniques, are often used to estimate a location (e.g. geolocation) of a signal source (e.g. RF emitter).

In many cases data indicative of direction of propagation of waveform of the electromagnetic field/signal of interest may further be used in combination with the above geolocation techniques in order to improve the accuracy of the estimated location/geolocation, and/or to reduce/filter out estimation errors.

Indeed, the capability of electromagnetic vector sensors to estimate the direction of propagation of a waveform sensed at a certain point in space, may be combined/fitted with TDOA and/or FDOA information in order to better estimate a location of a signal source of interest.

However, conventional geolocation techniques, as well spectrum monitoring systems (e.g. TDOA, FDOA, and/or DF, DPD), degrade their performance when applied over harsh electromagnetic environments (such as experienced in highly interfered areas and/or multipath environments). The disrupted EM environment is characterized by frequency re-use and propagation implications (scattering, diffractions and reflections). This EM environment causes a multi-wavefront to impinge the system reception antenna. Due to inherent complexity of accuracy geolocation systems on the one hand, and required simplicity of monitoring systems on the other hand, multi-wavefront scenarios are generally not considered, and miss-modeling errors are experienced.

Moreover, performance of conventional techniques for estimating the direction of propagation of a waveform based on the properties of the electromagnetic field sensed by an electromagnetic vector sensor, also degrade significantly in the presence of such harsh electromagnetic conditions as expressed in highly interfered areas and/or multipath environments.

Therefore, using the known in the art techniques for locating electromagnetic signal sources (e.g. RF emitters), are deficient in highly interfered electromagnetic conditions and multipath environments, and are prone to relatively high error rate (false location identification), and/or are inoperative in such scenarios.

However, the inventors of the present invention found novel techniques for direction finding, based on electromagnetic vector sensor measurements, which operate robustly under interfered/multipath electromagnetic conditions, while generally enabling to discriminate between single wavefront and multi-wavefront conditions detected by an electromagnetic vector sensor. Most scenarios also enable to subsequently determine the accurate direction of arrival with high probability and low false-alarm/error rate, or otherwise, in case of multiple wavefronts, enable to determine that a waveform's direction of arrival (DOA) estimated by such a sensed multi-wavefront, would be inaccurate/wrong. Accordingly, considering that some aspects of the technique of the present invention enable accurate and reliable finding of DOA under harsh interference EM conditions, the inventors of the present invention also devised a way to utilize/harness such discrimination methodology to discriminate between single and multiple wavefronts, for further enabling accurate geolocation and/or spectrum monitoring under such harsh interference EM conditions as well.

In order to better understand the principles of the present invention, first the principles of the analytical DOA finding techniques based on EM vector sensors, and why are those techniques prone to error in the presence of harsh interference EM conditions, are briefly reviewed. Then, the novel technique of the present invention for discriminating between single wavefront and multi-wavefront conditions detected by an electromagnetic vector sensor (e.g. by a single vector sensor as opposed to techniques utilizing an array/multitude of such sensors) and to subsequently enable accurate determination of the direction of arrival, are explained. Finally, the use/incorporation of the discrimination methodology determined according to the technique of the invention for facilitating the accurate location/geolocation and/or spectral properties of the signal source under these harsh interference EM conditions, are further described.

Principles of DOA Finding Based on EM Vector Sensors (e.g. Analytical)

The direction of propagation/arrival (DOA) of an arbitrary single waveform sensed by an electromagnetic vector sensor, can be determined by employing direct/analytical methods on the EM field components that are measured by the sensor.

An example of a vector sensor apparatus adapted for measuring electric and magnetic field projections along three perpendicular distinct axes, as provided in U.S. Pat. No. 9,541,370, is illustrated schematically in FIG. 1A. The exemplified apparatus includes three antenna arrangements 91, 92, 93 each having antennas for sensing both magnetic and electric fields, whereby each arrangement of the arrangements 91-93 has a non-zero projection on a respective axis from among the three axes. Thus, an arrangement 91 is designated to sense electric field projection along axis Y and a magnetic field projection along the same axis. Similarly, arrangement 92 is designated to sense electric field projection along axis X and a magnetic field projection along the same axis, and, likewise, arrangement 93 is designated to sense electric field projection along axis Z and a magnetic field projection along the same axis. It should be understood that the antenna arrangements may not necessarily be arranged along three respectively perpendicular axes, but it may be sufficient that their axes span a three dimensional space.

The analytic calculations to determine the direction of propagation of an arbitrary single planar EM wavefront based on the EM field components sensed by an EM vector sensor are briefly described in the following in relation to FIG. 1B. FIG. 1B illustrates in a self-explanatory manner, such an arbitrary single planar EM wavefront traveling in the $-\hat{r}$ direction. The electric field $\hat{E}$ lies within the plane perpendicular to propagation direction. The field may be spanned to the cardinal unit directions of a spherical coordinate system $[\hat{r} \; \hat{\theta} \; \hat{\varphi}]$. Since the field may possess an arbitrary polarization, the general form of the field may be expressed by:

$$\vec{E} = |E|[\sin\tau e^{j\gamma} \; \cos\tau]\begin{bmatrix}\hat{\theta}\\\hat{\phi}\end{bmatrix} = E_\theta\hat{\theta} + E_\phi\hat{\phi} \quad (1)$$

where $\tau, \gamma$ are the polarization parameters pertaining to tilt angle and phase lag between cardinal vector space components of the polarization space, e.g. $(\hat{\theta},\hat{\varphi})$, respectively.

The magnetic field $\vec{H}$ of the planar wavefront propagating in $-\hat{r}$ direction may be expressed by:

$$\vec{H} = -\hat{r}\times\frac{\vec{E}}{\eta} = \frac{|E|}{\eta}[\cos\tau \; -\sin\tau e^{j\gamma}]\begin{bmatrix}\hat{\theta}\\\hat{\phi}\end{bmatrix} = \frac{1}{\eta}(E_\phi\hat{\theta} - E_\theta\hat{\phi}) \quad (2)$$

where here $\eta$ is the wave impedance (e.g. vacuum wave impedance).

Note that wavefront propagating in the direction $\hat{r}$ shall yield the negative of the magnetic field $\vec{H}$ of Eq. 2.

As is generally known, the direction or propagation of the arbitrary wavefront, $-\hat{r}$, generally equals to the direction of the so-called Poynting vector (i.e. $\vec{S}=\vec{E}\times\overline{\vec{H}}$) of the arbitrary wavefront. Accordingly, the direction of the arbitrary wavefront $-\hat{r}$ may be obtained in terms the angles of arrival $(\theta,\varphi)$ by computing the vector multiplication of the normalized electric field and the normalized magnetic field, $$\frac{\vec{E}}{|E|} \text{ and } \frac{\vec{E}}{|H|},$$

presented in the Cartesian coordinate space. For instance, by using the common transformation matrix to Cartesian as provided in the following Eq. (3), the electric and magnetic fields presented in Eq. (1) and (2) may be given in Cartesian coordinates in the form shown in Eqs. (4) and (5), as follows:

$$\begin{bmatrix} \hat{x} \\ \hat{y} \\ \hat{z} \end{bmatrix} = \begin{bmatrix} \sin\theta\cos\phi & \cos\theta\cos\phi & -\sin\phi \\ \sin\theta\sin\phi & \cos\theta\sin\phi & \cos\phi \\ \cos\theta & -\sin\theta & 0 \end{bmatrix} \begin{bmatrix} \hat{r} \\ \hat{\theta} \\ \hat{\phi} \end{bmatrix} \quad (3)$$

The $\hat{\theta}$ and $\hat{\phi}$ components of the fields are transformed using equations (4) and (5) hereunder:

$$\begin{bmatrix} E_x \\ E_y \\ E_z \end{bmatrix} = E \begin{bmatrix} \sin\theta\cos\phi & \cos\theta\cos\phi & -\sin\phi \\ \sin\theta\sin\phi & \cos\theta\sin\phi & \cos\phi \\ \cos\theta & -\sin\theta & 0 \end{bmatrix} \begin{bmatrix} 0 \\ \sin\tau e^{j\gamma} \\ \cos\tau \end{bmatrix} = \quad (4)$$

$$E \begin{bmatrix} \overbrace{\cos\theta\cos\phi}^{\theta} & \overbrace{-\sin\phi}^{\phi} \\ \cos\theta\sin\phi & \cos\phi \\ -\sin\theta & 0 \end{bmatrix} \begin{bmatrix} \sin\tau e^{j\gamma} \\ \cos\tau \end{bmatrix}$$

$$\begin{bmatrix} H_x \\ H_y \\ H_z \end{bmatrix} = \frac{E}{\eta} \begin{bmatrix} \sin\theta\cos\phi & \cos\theta\cos\phi & -\sin\phi \\ \sin\theta\sin\phi & \cos\theta\sin\phi & \cos\phi \\ \cos\theta & -\sin\theta & 0 \end{bmatrix} \begin{bmatrix} 0 \\ \cos\tau \\ -\sin\tau e^{j\gamma} \end{bmatrix} = \quad (5)$$

$$\frac{E}{\eta} \begin{bmatrix} \overbrace{\cos\theta\cos\phi}^{\theta} & \overbrace{-\sin\phi}^{\phi} \\ \cos\theta\sin\phi & \cos\phi \\ -\sin\theta & 0 \end{bmatrix} \begin{bmatrix} \cos\tau \\ -\sin\tau e^{j\gamma} \end{bmatrix} =$$

$$\frac{E}{\eta} \begin{bmatrix} \sin\phi & \cos\theta\cos\phi \\ -\cos\phi & \cos\theta\sin\phi \\ 0 & -\sin\theta \end{bmatrix} \begin{bmatrix} \sin\tau e^{j\gamma} \\ \cos\tau \end{bmatrix}$$

Thus, the Cartesian components of the normalized $\hat{E}$ and $\hat{H}$ fields, $$\hat{E} = \frac{\vec{E}}{|E|} \text{ and } \hat{H} = \frac{\vec{H}}{|H|}$$

(normalized by their magnitudes), of the electromagnetic field may be presented in the following generalized vector form $\vec{X}$ as function of the direction (angles) of arrival if the wavefront to the vector sensor $(\theta,\varphi)$ and the polarization parameters of the wavefront $(\gamma,\tau)$:

$$\vec{X} = \begin{bmatrix} \hat{E}_x \\ \hat{E}_y \\ \hat{E}_z \\ \hat{H}_x \\ \hat{H}_y \\ \hat{H}_z \end{bmatrix} = D \overbrace{\begin{bmatrix} \cos\theta\cos\phi & -\sin\phi \\ \cos\theta\sin\phi & \cos\phi \\ -\sin\theta & 0 \\ \sin\phi & \cos\theta\cos\phi \\ -\cos\phi & \cos\theta\sin\phi \\ 0 & -\sin\theta \end{bmatrix}}^{F(\theta,\phi)} \overbrace{\begin{bmatrix} \sin\tau e^{j\gamma} \\ \cos\tau \end{bmatrix}}^{g(\gamma,\tau)} \quad (6)$$

Were here D is conditioning matrix containing parameters like n (the wave impedance). In general, the model shown in (6) describes projection of a single arbitrary polarized $(\gamma,\tau)$ wavefront impinging a vector sensor from a direction $(\theta,\varphi)$. In case the vector sensor directly includes orthogonal antenna elements capable separately sensing the components of the electric and magnetic fields E and H with respect to the Cartesian axes, the vector $\vec{X}$ is actually indicative of the port voltages measured at these antenna elements after those have been possibly filtered to obtain the measurements of the electromagnetic field oscillating at a particular frequency of interest and normalized.

Thus, using the conventional approach, the direction of arrival $(\theta,\varphi)$ of an arbitrary single waveform at a certain frequency impinging the vector sensor may be determined from the measurement of the generalized EM field vector X measured by the vector sensor.

Indeed, in case of a plurality of wave fronts of essentially different frequencies impinging the vector sensor simultaneously, the electric and magnetic field components pertaining to each frequency can be isolated, (provided that the different frequencies are sufficiently distinct. In this regard, sufficiently distinct frequencies may pertain to frequencies whose difference Δω is greater than the resolution bandwidth of the proceeding (RBW) (e.g. the spacing between bins which can be obtained by Fourier transform of the sampled signal. Accordingly, in case that only a single waveform of a certain particular frequency of interest impinges the sensors, the waveforms of other frequencies can be filtered out, and the direction of arrival $(\theta,\varphi)$ of the single waveform impinging of the frequency of interest can be determined after filtration.

However, this relatively straightforward approach, according to which the direction of arrival is determined directly (e.g. analytically) from the measured vector components of the EM field, severely degrades in harsh interference conditions where multiple wave-fronts in the frequency of interest (or substantially near the frequency of interest (e.g. here, near may be considered with respect to the RBW) impinge the vector sensor at the same time. Such scenarios often occur in multipath environments (e.g. urban areas) in which multiple reflections of the same electromagnetic waveform reach the vector sensor substantially simultaneously, or in dense electromagnetic environments, in which there are many EM sources transmitting in similar frequency bands.

Indeed, some known techniques (e.g. U.S. Pat. No. 8,686,913 and WO16053441 discussed above) attempt to mitigate such problems in determining the direction of arrival in multipath environments.

In this connection U.S. Pat. No. 8,686,913 suggest to distinguish coherent multipath signals and resolve multiple angles-of-arrival (AoA) signals by utilizing a differential vector sensor generally including six antenna arrays arranged in three spaced apart antenna array pairs whereby each pair faces a different Cartesian axis.

Indeed the differential vector sensor suggested in U.S. Pat. No. 8,686,913 is capable of measuring additional information of the electromagnetic field at the location of the sensor—that is being differential information of the EM field, and thus measuring up to nine degrees of freedom, by which U.S. Pat. No. 8,686,913 suggests to utilize to distinguish between coherent multipath signals. However, this approach is on the one hand limited to the number of coherent multipath signals whose direction of arrival can be distinguished (e.g. the 9 degrees of freedom measured by the proposed sensor allow to distinguish between two coherent signals at optimal conditions, but would still yield erroneous direction of arrival results in case of three or more coherent signals). On the other hand, a major drawback of the differential vector sensor suggested in this publication is its complexity, size, and energy consumption, as it requires to accommodate and operate 6 antenna arrays for the purpose of obtaining nine differential types of information on the EM field at the center of the sensor.

Discrimination Between Single and Multi-Wavefront Conditions According to the Present Invention and Subsequent Determination of Accurate DOA The inventors of the present invention have understood that although under the harsh interference/multipath conditions, most time periods/slots are contaminated periods, during which the EM vector sensor is impinged by a plurality of wavefronts associated with effects (e.g. scattering, diffractions and reflections), still there generally/typically exist some reception periods, also referred to herein as uncontaminated periods, during which the EM vector sensor is impinged by only a single wavefront. Accordingly, the inventors of the present invention have conceived a novel technique, system and method, for receiving and processing the signals of an EM vector sensor to distinguish between signals obtained during the uncontaminated periods, from signals obtained during contaminated periods. Accordingly, the technique of the present invention provides for processing the signals measured by a vector sensor to mark reception periods at which only single wavefront impinges the reception antennas of the vector sensor, and distinguish them from contaminated periods where multi-wavefront condition exists. Indeed, once such distinction is made, the technique of the present invention allows to ignore the signals obtained during the contaminated periods, and not use such signals to estimate the DOA of a wavefront, as such estimation is, as indicated above, prone to severe inaccuracies and may be completely erroneous. On the other hand, according to some implementations of the technique of the invention, once un-contaminated (clean) reception periods are identified (at which only a single wavefront impinges the sensor), the signals received by the vector sensor at such periods can be used to provide accurate estimate of the DOA and Polarization (e.g. state of polarization SOP) of the signals and thus may also be used to proceed with location/geolocation finding of the signal source by additional means such as TDOA and/or FDOA, or for determining the spectral properties of the signal.

Moreover, it should be noted that some embodiments of the technique of the present invention are further adapted to provide an accurate estimation of the polarization properties, i.e. state of polarization SOP, of the received signal, based on the measurements obtained by the EM vector sensor during the uncontaminated periods.

Furthermore, in some other embodiments of the technique of the present invention, an a priori known DOA and/or SOP may be further exploited to tag contaminated periods from un-contaminated periods (where here the terms contaminated and un-contaminated pertain to periods during which the vector sensor measures waveforms associated with interference/multipath conditions or without such interference/multipath conditions).

The vector sensor to be used for the purpose of the present invention may generally be any suitable known in the art EM vector sensor capable of sensing/estimating the vector components of the electric and magnetic fields, E and H of a propagating EM field/wavefront at a point in space. As a particular example, and for the purpose of clarity of the following disclosure of the present invention, a vector sensor technology such as that disclosed in U.S. Pat. No. 9,041,400 may be used and/or incorporated in the technology of the present invention, in order to improve the performance of the conventional systems and provide robust performance under such interfered EM scenarios.

According to one broad aspect of the present invention there is provided a method to determine properties of an electromagnetic waveform. The method includes:

providing measured parametric EM field data (e.g. which is also known in the art and sometimes referred to herein as measured steering vector) indicative of measured vector components of electric and magnetic fields of an EM waveform measured at a certain location in at least one instance of time;

providing reference data indicative of a plurality of reference data sets. Each data set includes: a reference steering vector parameters (also referred to herein as steering parameters or steering params') indicative of a certain respective direction of arrival (DOA), and a corresponding parametric EM field reference data (e.g. which is also known in the art and sometimes referred to herein the art as a reference "steering vector") including reference vector components of an electric and magnetic field pertaining to a wavefront propagating with the DOA of the corresponding reference steering vector parameters;

determining a matching score between the measured parametric EM field data (the measured steering vector) and the parametric EM field reference data (the reference steering vectors) of one or more of the reference data sets; and in case the matching score of a certain reference data set complies with a certain threshold condition, determining that said measured parametric EM field data corresponds to said EM waveform having a single EM wavefront thereby enabling to discriminate between measured EM waveforms having a single wavefront and measured EM waveforms having multiple wavefronts.

According to some embodiments of the present invention the method further includes, upon determining that said EM waveform has a single EM wavefront, estimating a DOA of said single EM wavefront based on the reference steering vector parameters of said certain reference data set whose matching score complies with said certain threshold condition.

In some embodiments the method includes determining a plurality of matching scores between the measured parametric EM field data and the parametric EM field reference data of each reference data set of said plurality of reference data sets respectively; and in case none of the plurality of matching scores complies with the certain threshold condition, determining that the measured parametric EM field data corresponds to the EM field measured under interference conditions (e.g. and that therefore DOA cannot be accurately estimated thereby).

In some implementations the method includes determining a plurality of matching scores between the measured parametric EM field data and the parametric EM field reference data of each reference data set of the plurality of reference data sets respectively In case one or more matching scores associated with a certain respective one or more candidate reference data sets comply with said certain threshold condition, applying further processing to filter the certain respective candidate reference data set, based on predetermined data (e.g. a priory known) on properties of a source of said electromagnetic waveform. Accordingly, such filtration provides for filtering out, from the one or more candidate reference data sets, the candidate reference data sets whose respective reference steering vectors' parameters do not comply with the predetermined data about the electromagnetic waveform as expected or its source. Specifically in some implementations such predetermined data may be particularly relating to a state of polarization of the electromagnetic waveform expected from the source or the source itself (e.g. indicative of the state of polarization being linear, circular or elliptical polarization). This enables to discriminate between single path waveforms, and multipath waveforms associated—with/caused—by reflection/scattering from objects that are in relative vicinity to the source (e.g. in relative vicinity as compared to their distance from the vector sensor—or in other words multipath waveforms that arrive to the vector sensor with angular orientation (e.g. DOA) that is close to that of the main waveform that arrives to the vector sensor directly from the source).

In some implementations of the method, the measured parametric EM field data is indicative of nominal vector components of the electric and magnetic fields obtained from a plurality of measurements of the electric and magnetic fields at the certain location of the vector sensor, which are taken in a plurality of time instances (time periods/frames). To this end, in some embodiments the nominal vector components of the electric and magnetic fields are obtained by processing the plurality of measurements of the electric and magnetic fields that are taken in the plurality of time instances. For instance the processing may include averaging of the plurality of measurements, or alternatively or additionally performing coherent integration of plurality of measurements, or yet alternatively or additionally applying certain filtration to the plurality of measurements (e.g. before or after averaging or coherent integration is made). In this regards, the phrase coherent integration should be understood herein as generally relating to an integration/summation that incorporates the phase relations between the integrated entities, e.g. samples/channels.

It should be noted that in some embodiments the measured vector components may be obtained from the vector sensor while the latter being under movement conditions.

In some implementations the nominal vector components of the electric and magnetic fields may pertain to electric and magnetic fields of a certain frequency. In such implementations, the plurality of reference data sets generally include frequency specific reference data sets, whose parametric EM field reference data pertain to the certain frequency.

In some embodiments the measured parametric EM field data itself pertains to a certain frequency.

In some embodiments the method includes processing of the plurality of measurements of the electric and magnetic fields that are taken in a plurality of time instances, to determine frequency contents of the measured electric and magnetic fields in at least the above mentioned certain frequency. Accordingly the nominal vector components pertain to amplitudes of components of the electric and magnetic fields associated with said certain frequency. For example such processing may include applying Fourier Transform to the measurements of the electric and magnetic fields taken in the plurality of time instances, and/or applying a narrow pass band filtering to such measurements, and/or by applying thereto digital down conversion (DDC).

In some embodiments of the present invention the matching score between the measured parametric EM field data and the parametric EM field reference data of a certain reference data set is determined by computing an inner product between values (e.g. normalized values) of the measured parametric EM field data and the parametric EM field reference data of the certain reference data set. In this regards it should be understood that here the term inner product may pertain to a simple inner product (e.g. also known as dot-product), or in some embodiments is performed as a generalized (coherent) inner product which is computed based on a covariance of the measured parametric EM field data and the parametric EM field reference data of the certain reference data set.

In some implementations the nominal vector components of the electric and magnetic fields pertain to electric and magnetic fields of a certain temporal form. In such implementations the plurality of reference data sets include reference data sets associated with one or more predetermined temporal forms. For example a certain temporal form of the nominal vector components of the electric and magnetic fields and the one or more predetermined temporal forms of the plurality of reference data sets may be pulsed temporal forms of predetermined widths.

In such implementations (e.g. where the reference data and the measured EM filed may be presented in temporal forms), the matching score between the measured parametric EM field data and the parametric EM field reference data of a certain reference data set may be determined by computing a correlation between normalized values of the measured parametric EM field data and the parametric EM field reference data of the certain reference data set.

In some embodiments the certain threshold value against which the matching scores are compared to determine whether their corresponding data sets may be candidates for representing the waveform that was actually measured is set to have a value within a range between 0.9 and 1. It should be however noted that the threshold may also be set to different values on various implementations and/or may be adjusted dynamically based on the measurements/comparison results (e.g. so as to obtain a single candidate).

In some embodiments the reference steering vector parameters of at least one reference data set in the reference data, is indicative of a two dimensional direction of arrival (DOA) of the corresponding parametric EM field reference data characterized by $(\Theta,\phi)$. In such cases determining compliance of the matching score with the certain threshold condition may be used to provide an estimate of two dimensional direction of arrival (DOA) of a wavefront associated with the measured parametric EM field (an unambiguous may be obtained, e.g. in case only one candidate reference data set was obtained).

In some embodiments the reference steering vector parameters of at least one reference data set of the reference data, may be indicative of polarization parameters of the corresponding parametric EM field reference data. In such cases, determining compliance of the matching score with the certain threshold condition may be used to provide an estimate of the direction of arrival (DOA) of a wavefront associated with the measured parametric EM field and polarized with said polarization parameters (also here an un-ambiguous may be obtained, e.g. in case only one candidate reference data set was obtained).

In some embodiments the measured parametric EM field is obtained by a parametric EM field sensing device (vector sensor). The vector sensor may be in some embodiments a single device located at a certain location or it may be a distributed device whose antenna elements (e.g. the six antenna elements measuring different components of the electric and magnetic fields) are distributed in several locations. In any of these cases as long as the distances between the antenna elements of the vector sensor are in the order of a wavelength or less of the EM field which is to be measured, it may be considered as a vector sensor that is located at a certain location.

Such parametric EM field sensing device (e.g. vector sensor) may include three or more sensing modules (antenna elements) arranged to span sensing of an electric field in 3D coordinates. Such parametric EM field sensing device may include three or more sensing modules (antenna elements) arranged to span sensing of a magnetic field in 3D coordinates.

In this regards it should be noted that in some embodiments the reference data may include, or be constituted by reference data that is specific to a type of the parametric EM field sensing device which is used. Also in some embodiments the reference data may be adapted to compensate over warping/distortion effect of the EM field sensing device on the measured parametric EM field that is sensed by the EM field sensing device. For instance, each data set of the plurality of reference data sets of the reference data may be indicative of the parameters of the EM field that would be measured by the type of parametric EM field sensing device in response to an EM wavefront arriving from the certain respective direction of arrival (DOA) indicated by the corresponding steering vector parameters and sensed by that type of parametric EM field sensing device. In some embodiments the reference data may also be adjusted/a-priory-set according to the certain location/platform at which the parametric EM field sensing device is placed, so as to compensate over warping effect of objects in the vicinity of that location/platform on the measured parametric EM field sensed by the parametric EM field sensing device.

It should be noted that in some embodiments the method of the present invention is adapted for operating with the measured parametric EM field that is obtained by a single parametric EM field sensing device (vector sensor).

According to another broad aspect of the present invention there is provided a system for determining properties of an electromagnetic waveform. The system includes:

a measurements' preprocessor module connectable to a vector sensor and adapted to provide measured parametric EM field data (e.g. measured steering vector) indicative of measured vector components of electric and magnetic fields of an EM waveform measured in at least one instance of time (e.g. e.g. by the vector sensor being at a certain location);

a reference data provider module connectable to a reference data repository comprising reference data and adapted to provide a plurality of reference data sets. Each data set includes: a reference steering vector parameters indicative of a certain respective direction of arrival (DOA), and a corresponding parametric EM field reference data (e.g. reference steering vector) including reference vector components of an electric and magnetic field pertaining to a wavefront propagating with the DOA of the corresponding reference steering vector parameters;

a comparison module configured and operable for determining matching scores between the measured parametric EM field data and the parametric EM field reference data of one or more of the reference data sets; and an interference estimator module configured to determine whether the EM waveform having a single EM wavefront based on compliance of at least one of the matching scores with a certain threshold condition.

The system of the present invention thereby enable discrimination between measured EM waveforms having a single wavefront and measured EM waveforms having multiple wavefronts.

In some implementations of the system the comparison module is adapted to determine as candidate reference data sets, one or more of the reference data sets whose respective matching scores comply with said certain threshold condition. The system may include a DOA/SOP estimator module configured and operable for estimating a DOA of the EM wavefront based on the reference steering vector parameters of the certain reference data set whose matching score complies with the certain threshold condition.

In some implementations of the system the interference estimator module is adapted to determine that in case none of the matching scores complies the certain threshold condition, the measured parametric EM field data corresponds to the EM field measured under interference conditions (e.g. by which DOA cannot be accurately estimated).

In some embodiments, the comparison module of the system is configured and operable for determine as candidate reference data sets, one or more than one of the reference data sets whose respective matching scores comply with the certain threshold condition. In such embodiments the interference estimator module may further include a filtration module (e.g. also referred to below as SOP filter) that is configured and operable to filter out form the one or more candidate reference data sets, certain candidate reference data sets whose respective reference steering vectors' parameters do not comply with the predetermined data about the properties of a source of the EM waveform. In this regards it should be noted that the predetermined data may in some embodiments pertain to a-priory data indicative of a state of polarization of the source (e.g. or of an expected waveform arriving directly from such source and sensed by the vector sensor).

In some embodiments, the measurements preprocessor module of the system is adapted to obtain a plurality of measurements of the electric and magnetic fields, which are taken in a plurality of time instances, and is configured and operable for processing such plurality of measurements and obtain the measured parametric EM field data as indicative of nominal vector components of the electric and magnetic fields. For instance such processing by the measurements preprocessor module may include applying averaging to the plurality of measurements; and/or applying coherent integration to the plurality of measurements.

It should be noted that in some embodiments the system is capable of obtaining the measured vector components from the sensor while the latter is being under movement conditions.

In some embodiments the nominal vector components of the electric and magnetic fields pertain to electric and magnetic fields of a certain frequency In this case the plurality of reference data sets may include frequency specific reference data sets whose parametric EM field reference data pertain to that certain frequency. The processing by the measurements preprocessor module may include processing of at least a certain frequency of a frequency content to said plurality of measurements of said electric and magnetic fields taken in the plurality of time instances, such that the above indicated nominal vector components pertain to amplitudes (e.g. complex numbers pertaining to amplitude and phase) of components of the electric and magnetic fields associated with said certain frequency. For example the processing by the measurements preprocessor module may include applying at least one of the following to the measurements of the electric and magnetic fields that are obtained in the plurality of time instances: a Fourier Transform, a narrow pass band filtering, and digital down conversion (DDC).

In some implementations the comparison module of the system is configured and operable for determining said matching scores between the measured parametric EM field data and the reference data sets by respectively computing inner products between normalized values of the measured parametric EM field data and the corresponding parametric EM field reference data of the respective reference data sets. As indicated above the inner products may be for example generalized (coherent) inner products that are computed based on covariance of said measured parametric EM field data and the corresponding parametric EM field reference data of the respective reference data sets.

According to some implementations, the nominal vector components of the electric and magnetic fields pertain to electric and magnetic fields of a certain temporal form. In such implementations the plurality of reference data sets may include reference data sets associated with one or more predetermined temporal forms. For example the above mentioned certain temporal form and one or more predetermined temporal forms may be the forms of temporal pulses of predetermined temporal widths. In such implementations the comparison module may be configured and operable for determining the respective matching scores between the measured parametric EM field data and the parametric EM field reference data of respective reference data sets by computing correlations between normalized values of the measured parametric EM field data and the corresponding parametric EM field reference data of the respective reference data sets.

In some embodiments of the system, the reference steering vector parameters of at least one reference data set of said reference data, is indicative of one or more of the following:
  direction of arrival (DOA) of the corresponding parametric EM field reference data characterized by $(\Theta,\phi)$;
  polarization parameters of the corresponding parametric EM field reference data.

In some implementations the system comprises or is being connected to a parametric EM field sensing device (vector sensor). In such implementations reference data may be, or may include, reference data that is specific to a type of said parametric EM field sensing device associated with the system. Such specific reference data may include compensation over warping/distortion effect of said EM field sensing device on the measured parametric EM field sensed by the EM field sensing device.

In some implementations the system is configured and operable with a single parametric EM field sensing device. The parametric EM field sensing device may be located at a certain location or platform and wherein said reference data may be adjusted according to said certain location or platform so as to compensate over warping effect of objects in the vicinity of said certain location or platform location.

Accurate Location and/or Spectral Properties of the Signal Source Under Harsh Interference EM Conditions As indicated above, once waveforms measured under no/mild interference/multipath conditions are discriminated from waveforms measured under waveforms harsh interference/multipath conditions, the measured data (e.g. the signal samples of from the antennas) obtained during the time periods at which no interference/multipath conditions were sensed (referred to herein as non-interfered time periods), and/or in some embodiments data indicative of those non-interfered time periods themselves, may be used for accurate direction finding (DOA), and/or for further determining accurate location/geolocation and/or spectral properties of the signal source. Accordingly, the technique of the present invention enables to obtain accurate direction finding (DOA), and/or accurate location/geolocation and/or spectral properties of the signal source under harsh interference EM conditions. This is achieved by identifying temporal periods during which the interference EM conditions are reduced, and utilizing/analyzing the signals (e.g. the respective samples of signals) received from the source during those identified non-interfered time periods) for further accurate determination of the DOA, geo-location, spectral properties and/or other properties of the signal source.

In this regard it might be noted that various techniques for geolocation a signal source or analyzing the spectral properties therefor, utilize beam forming and/or phased arrays antenna to receive the wavefront from the signal source. Indeed, under interference electromagnetic conditions, the receiving phased arrays antenna used in such techniques is impinged by the plurality of wavefronts arriving from various directions, whereby often the various directions may be relatively close to one another. For example, in multipath scenarios the angular difference between the main beam arriving from the signal source/emitter, and the prominent secondary multipath beams being prominent reflections/scatterings of the main beam, may be only a few degrees. Thus, in such scenarios, in the absence of accurate DOA information, as is generally the case with current conventional direction finding techniques in the presence of harsh interference conditions, it is not practical to apply narrow enough spatial beamforming to the signal received by antennas of TDOA/FDOA and/or spectral analysis systems.

However, as the present invention according to its aspects described above provides DOA and/or SOP even under harsh EM conditions, the samples/time-periods providing such accurate DOA and/or SOP may be further used according to some aspects of the present invention in order to reduce multi-wavefront effects in signal source location system and/or in spectral analysis systems.

In other words, according to above technique for estimating the direction/polarization of the signal DOA and/or SOP properties of the source/emitter estimated as described above, or the signal samples obtained at durations where no interference effects we identified, can be used/harnessed for filtering the signal received by geolocation and/or spectral analysis systems (e.g. applying spatial/polarization filtration based on the DOA/SOP determined by the above technique, or applying temporal filtration according to the periods of no-interference as indicated above) so as to remove and/or substantially reduce the weight/significance of interfering signals arriving from different DOAs or at different polarization states. This may be achieved by applying beam forming and/or polarization discrimination to the received signals according to the specific direction or arrival and/or polarization state obtained by the vector sensor in the above technique. Accordingly, the reception of wavefronts from different direction/polarization states are decayed, and the filtered reception then can be further manipulated by conventional processes (e.g. TDOA, FDOA) and/or spectral analysis in order to determine the properties of the main signal/beam arriving from the signal source (the location/geolocation of the signal source and/or its spectral content).

For instance, in case of an EM vector sensor operated according to the technique of the present invention, and located adjacent to a signal source location system, and/or spectral analysis system, having beamforming capabilities and/or polarization discrimination capabilities, the DOA and/or SOP obtained according to the technique of the present invention from that adjacent vector sensor, may be directly used in the nearby signal source location system, and/or spectral analysis system to filter out multipath signals arriving from directions other than the main beam directly arriving from the signal source of interest or with different polarizations than that of the main beam.

Alternatively, or additionally, an array of a plurality of EM vector sensors can be utilized to enable filtration of the signals of such a signal source location system, and/or spectral analysis system, even in case all or some of the EM vector sensors of the array are not adjacent to the signal source location system, and/or spectral analysis systems. Indeed in case two or more DOAs of the signal source are estimated by, and relative to, two or more respective EM vector sensors located at different locations, a third DOA of the signal source relative to the location of the signal source location and/or spectral analysis system can also be estimated based on these two or more DOA, and, accordingly, a similar filtration as described above may be applied using the such estimated third DOA.

In this regard it should be noted than in general, whether one of the vector sensors whose signals are processed according to the technique of the present invention is located near the signal source location and/or spectral analysis system or not, use of additional vector sensors located at other locations and processing their signals according to the above technique may be used to further determine the DOA and SOP of the signal source relative to the signal source location and/or spectral analysis system, and thus enable higher resolution and tighter filtering of the signals received by the signal source location and/or spectral analysis system over the direction-polarization space to match the actual DOA and SOP of the signal source relative to the signal source location and/or spectral analysis system, with improved accuracy.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 1A is a schematic illustration exemplifying a configuration of an EM vector sensor;

FIG. 1B illustrates, in a self-explanatory manner, an arbitrary EM waveform having a single planar wavefront traveling in the $-\hat{r}$ direction (e.g. towards a vector sensor);

FIG. 2B to 2D together present a flow chart of a method 200 for performing such discrimination between measured waveforms having one or multiple wavefronts and optionally subsequently determining/estimating the DOA and possibly SOP of the electromagnetic wavefront, according to an embodiment of the present invention; whereby:

FIG. 2B specifically presents the operation/sub-method carried out in order to obtain measured parametric EM field data $\langle \vec{X} \rangle$ indicative of vector components of electric and magnetic fields measured during one or more time instances/frames;

FIG. 2C specifically presents the operation/sub-method carried out in order to provide, compute and/or measure reference data, including reference data sets, which are to be used according to the technique of the present invention; and FIG. 2D specifically presents the operation/sub-method carried out in order to determine matching score(s) between the measured parametric EM field data $\langle \vec{X} \rangle$ and one or more of the reference data sets $\{DS_i\}$, and thereby determining/estimating whether the measured parametric EM field data $\langle \vec{X} \rangle$ is characterized by one wavefront or by multiple wavefronts, and optionally subsequently determining/estimating the DOA and possibly SOP parameters of the measured parametric EM field data $\langle \vec{X} \rangle$;

DETAILED DESCRIPTION OF EMBODIMENTS

Figure 2A:
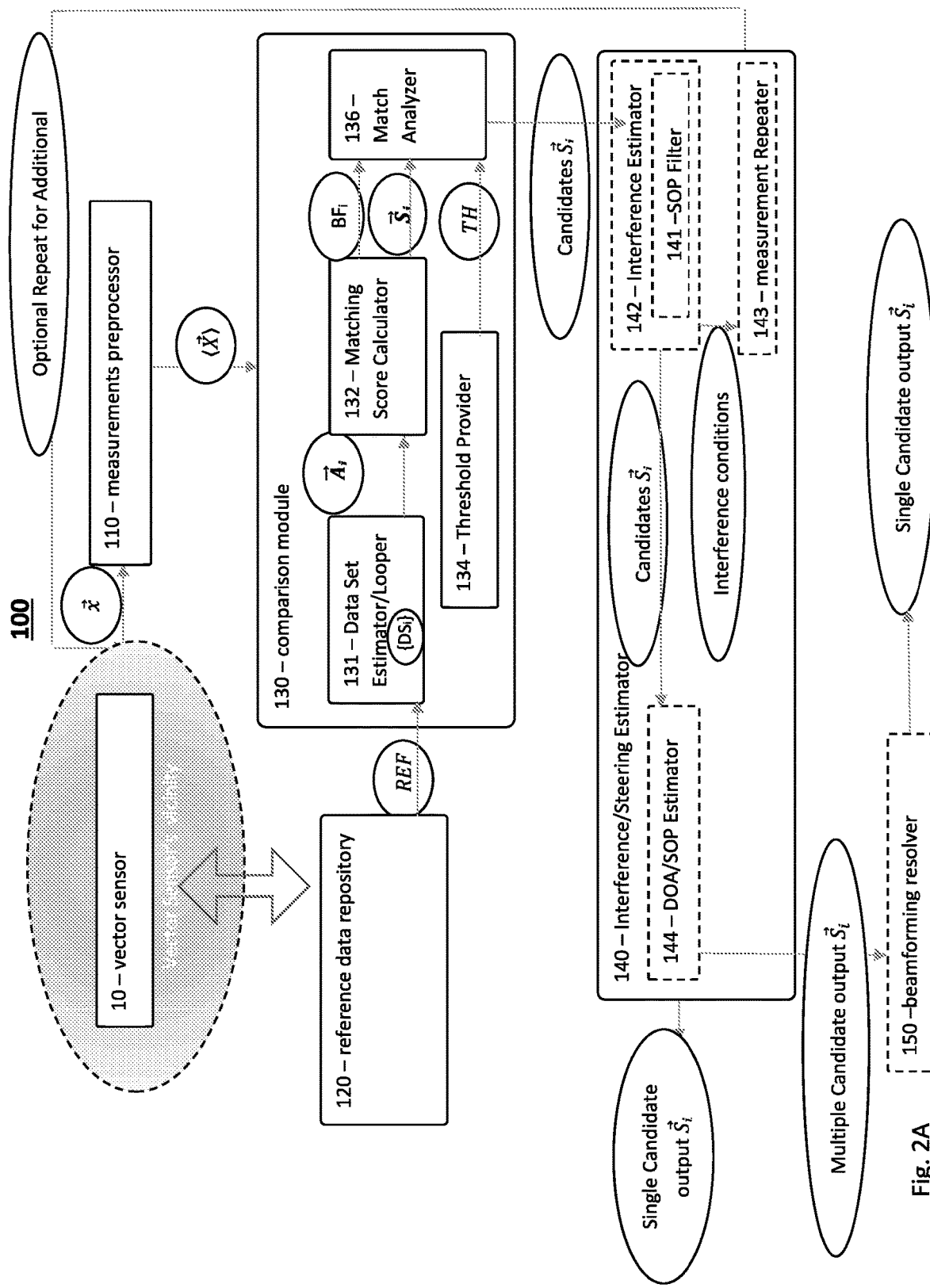
FIG. 2A shows a block diagram of a system 100 for discrimination between waveforms sensed/measured by a vector sensor having one or multiple wavefronts and optionally subsequent determination of direction of arrival (DOA) and possibly state of polarization (SOP) of the electromagnetic wavefront, according to an embodiment of the present invention.

Reference is now made together to FIGS. 2A to 2D, in which FIG. 2A is a block diagram of a system 100 for discrimination between waveforms sensed/measured by a vector sensor having one or multiple wavefronts (e.g. waveforms not subjected to interference/multipath conditions, or waveforms that are subjected to such conditions) and optionally subsequent determination of direction of arrival (DOA) and possibly state of polarization (SOP) of an electromagnetic wavefront according to an embodiment of the present invention; and FIG. 2B to 2D together presenting a flow chart of a method 200 for performing such discrimination between measured waveforms having one or multiple wavefronts and optionally subsequently determining/estimating the DOA and possibly SOP of the electromagnetic wavefront according to an embodiment of the present invention. The system 100 may be configured and operable for implementing various embodiments of the method 200. Accordingly, the configuration and operation of the system 100 and method 200 are described herein below together with reference to FIGS. 2A to 2D.

It should be noted that system 100 may generally include analogue and or digital modules adapted for connecting to the vector sensor (e.g. to the antenna elements thereof, their feeding points, and/or RF front-ends associated therewith, and/or digital processing modules of such vector sensors, to obtain therefrom signals/data indicative of the components of a waveform sensed/measured by the antenna elements of the vector sensor. The system may generally include any suitable analog/digital signal processing modules which may be adapted for performing preliminary processing on the received signals whereby such preliminary processing may include filtration of the signals (e.g. frequency filtration e.g. utilizing analog and/or digital pass/notch filters), down conversion of the signal, demodulation (e.g. utilizing signal mixers and/or digital demodulators) of the signals (e.g. to obtain the modulation and/or carrier components separately, down convection, phase shifting and/or analogue to digital conversion by suitable A/D convertors, or vice-versa digital to analogue conversion by suitable D/A convertors, all as may be required in particular embodiments of the present invention for the preliminary processing of the specific type of the signals which are to be analyzed by such embodiments. Moreover, system 100 may also include signal processors, typically digital processors, which may be implemented by proper CPU(s) and/or DSPs and memory/storage modules included in the system 100, or by other means (e.g. analog processing means as known in the art (e.g. signal delay lines, phase shifters, mixers, filters etc.) in order to apply the processing described below with reference to the system 100 and method 200 below. To this end, the modules of system 100 described in detail below may be implemented by such analog or digital means, and a person of ordinary skill in the art will readily appreciate that the present invention as described below may be implemented utilizing digital means and/or analog means and/or a combination of digital and analog means as indicated above for carrying out the invention according to the various embodiments thereof as described in detail below.

System 100 includes a wavefront measurements preprocessor module 110 connectable to a vector sensor 10 and adapted to receive/sample the parametric EM field components $x'=[E_x, E_y, E_z, H_x, H_y, H_z]^t$ measured by the vector sensor 10 at a certain one or more time instances, t, (e.g. at a certain sampling rate). Here, t may be the time/sample index of the obtained measurements/samples from the vector sensor and $[E_x, E_y, E_z, H_x, H_y, H_z]^t$ present the measured electromagnetic field and may correspond to the voltages measured at respective feeding ports of 6 antenna elements of the vector sensors, each designed to measure a different component of the magnetic and electric fields sensed by the sensor (e.g. in case the vector sensor comprise three orthogonal pairs of magnetic and electric antennas). The wavefront measurements preprocessor module 110 is adapted to obtain the samples $x^t$ of the measured electromagnetic field at one or more (typically a plurality) of time-instances/samples and preprocess those measurements (e.g. in the manner discussed in detail below with respect to FIG. 2B), so as to obtain measured parametric EM field data (e.g. a measured steering vector) $\langle \vec{X} \rangle$ for further use for accurately determining/estimating the DOA and/or SOP of the sensed EM field.

In this regard, for understanding the below description, it may be noted that the measured samples may be assumed to comply with the following general sensing model of the vector sensor. The measured EM field/waveform, sample at a sampling instant t may be linked to the signal $Sig_t$ that is transmitted by the signal source and received/sensed by the vector sensor as follows:

$$\vec{x}_t = \vec{h}_e Sig_t + \vec{q}_t$$

where t is the sampling index, $Sig_t$ is the raw signal (e.g. a complex number/scalar) that was transmitted from the source at the t-th sample, $h_e$ is the steering filter (e.g. being an operator in the temporal domain or frequency domain, which is sometimes generally referred to as vector effective height of the receiving antenna-system/vector-sensor) presenting how the waveform of the specific signal $Sig_t$ is received and measured as x, by the antenna elements of the vector sensor. Typically the operator $\vec{h}_e$ is independent of t and, while the t dependency of the measurement x, is associated with the temporal form of the specific signal/modulation $Sig_t$. In this connection it should be noted that the general description of the signal is not limited to its presentation in the frequency or time domain, and $\vec{h}_e$ is the response operator presenting the operation/response function of the vector sensor to the signal $Sig_t$. The operator $\vec{h}_e$ may be a vector function of the signal $Sig_t$ (e.g. convolution of the signal with vectorial impulse response function of the vector sensor, which may be the case when the processing is performed in the time domain) or in some cases the operator $\vec{h}_e$ may be presented as a vector multiplying the signal $Sig_t$ and presenting the how the vector components of the EM field would be measured by the vector sensor in response to the signal $Sig_t$ (e.g. when considering the frequency domain, the operator $\vec{h}_e$ may be a function of the frequency).

System 100 includes a reference data repository (e.g. local or remote memory module) storing reference data indicative of the response of the vector sensor 10 to being impinged by various single warfronts arriving from different directions (having different DOAs), and/or arriving with different states of polarization (SOPs). To this end the reference data REF is indicative of a plurality of reference data sets REF=$\{DS_i\}$, each data set $DS_i$ comprising: a reference steering vector parameters $\vec{S}_i$ and a corresponding reference parametric EM field data $\vec{A}_i$ (e.g. a corresponding reference steering vector). The reference steering vector parameters $\vec{S}_i$ is indicative of at least a certain respective direction of arrival, $\vec{S}_i=[\theta_i, \phi_i]$, and typically, according to some embodiments of the present invention is also indicative of certain SOP parameters $[\gamma_i, \tau_i]$ so that $\vec{S}_i$ is given as $\vec{S}_i=[\theta_i, \phi_i, \gamma_i, \tau_i]$. $\theta_i, \theta_i$ are azimuth and elevation angles of the direction of propagation of the single reference wavefront, and $\gamma_i, \tau_i$ are tilt and phase lag of cardinal polarization components. The corresponding reference steering vector (referend to herein as reference parametric EM field data) $\vec{A}_i$ is a generalized EM field vector $\vec{A}_i=[\hat{E}E_x^i \ \hat{E}E_y^i \ \hat{E}E_z^i \ \hat{H}H_x^i \ \hat{H}H_y^i \ \hat{H}H_z]$ presenting the response of the vector sensor 10 to an electromagnetic field arriving with the DOA and SOP parameters of its respective steering vector parameters $\vec{S}_i$. To this end the reference parametric EM field data $\vec{A}_i=[\hat{E}E_x^i \ \hat{E}E_y^i \ \hat{E}E_z \ \hat{H}H_x^i \ \hat{H}H_y^i \ \hat{H}H_z]$ is indicative of the vector components of electric and magnetic fields that are expected to be measured by the vector sensor 10 in response to an EM wavefront propagating with DOA and/or SOP corresponding to the reference steering vector parameters $\vec{S}_i$. Generally, the reference data includes a plurality of such data sets $\{DS_i\}$. Thus, the reference data, REF, may be presented as REF=$\{DS_i\}$=$\{[\vec{A}_i, \vec{S}_i]\}$. For example the reference data may be stored in the reference data repository 120 in the form of a lookup table or a model (e.g. empirical/analytical model in which each line is a reference dataset $DS_i$=$[\vec{A}_i, \vec{S}_i]$=$[[\hat{E}E_x{}^i \hat{E}E_y{}^i \hat{E}E_z{}^i \hat{H}H_x{}^i \hat{H}H_y{}^i \hat{H}H_z{}^i], [\theta_i,\phi_i,\gamma_i,\tau_i]]$ (this is e.g. a four dimensional table with the dimensions corresponding to the parameters of the steering vector parameters: $\theta,\phi,\gamma,\tau$). Alternatively or additionally in some embodiments, as indicated below, the reference data is split to partial reference data (the function F) depending on the DOA parameters $\theta,\phi$ and partial reference data (the function g) depending on the SOP parameters $\gamma,\tau$. In this case, the two dimensional lookup-tables/modes and may be provided in the reference data. In this regard, it should be noted that in some embodiments the part of the reference data (the function G) which depends on the SOP parameters $\gamma, \tau$, may be considered to be less affected by distortions (e.g. the matrix D below may be considered to be independent from the SOP parameters $\gamma,\tau$, or having only negligible dependence on these parameters), and thus this part may be modelled by the analytic function g as provided below or a somewhat modified one). It should be noted that the part of the reference data (the function F) which depends on the DOA parameters $\theta,\phi$, is generally more dependent on the distortions affecting the waveform by objects surrounding the vector sensor (e.g. the matrix D below may be considered to be relatively strongly dependent from the DOA parameters $\theta, \phi$). Accordingly, this part of the reference data is often provided in a lookup table presenting the response of the vector sensor (e.g. inclusive of the platform at which it is located/fixed and/or the surroundings at the vicinity of the vector sensor) to waveforms from different DOAs. However, nonetheless, still in some embodiments/cases, a model (e.g. empirical/analytical) may also be constructed to represent F relatively accurately and in such cases there may be no need for representing F in a lookup table.

To this end the reference parametric EM field data $\vec{A}_i$ may be represented as follows:

$$\vec{A} = \begin{bmatrix} \hat{E}_x \\ \hat{E}_y \\ \hat{E}_z \\ \hat{H}_x \\ \hat{H}_y \\ \hat{H}_z \end{bmatrix} = D \overbrace{\begin{bmatrix} \cos\theta\cos\phi & -\sin\phi \\ \cos\theta\sin\phi & \cos\phi \\ -\sin\theta & 0 \\ \sin\phi & \cos\theta\cos\phi \\ -\cos\phi & \cos\theta\sin\phi \\ 0 & -\sin\theta \end{bmatrix}}^{F(\theta,\phi)} \overbrace{\begin{bmatrix} \sin\tau e^{j\gamma} \\ \cos\tau \end{bmatrix}}^{\vec{g}(\gamma,\tau)}$$

where D is an empirical/measured/calculated matrix containing parameters like n (the wave impedance) and other potential normalization factors or other objects affecting warping of the EM field in the vicinity of the vector sensor 100.

Thus the matrix F ($\theta,\phi$) in the reference parametric EM field vector $\vec{A}$ indicates the part describing ($\theta,\phi$) dependency, and the vector $\vec{g}(\gamma, \tau)$ presents the polarization parameters related to ($\gamma, \tau$), and generally spans to orthogonal polarizations. In the specific non-limiting example above the $\vec{g}$ vector indicates vertical and horizontal polarization, (where ($\gamma, \tau$) are the phase lag between the components and tilt angle). Accordingly, the two columns matrix F respectively may be configured as follows: the first column relates to the vertical polarization $\hat{\theta}$ components of the reference parametric field $\vec{A}$ and the second column relates to the horizontal polarization $\vec{\phi}$ components of the reference parametric field $\vec{A}$.

F may include the theoretical projection matrix of the EM fields on the axes (e.g. Cartesian) of the vector sensor as well as the warping/distortion matrix D which presents the empirical/measured/calculated warping parameters/factors affecting the EM field/waveform due to objects/surroundings of the vector sensor, the medium's wave impedance, and other optionally also other normalization factors. Thus, D may be determined by calibration measurements (e.g. e.g. via antenna measurement system) and/or analytical computations. D may be dependent as described below on the frequency $\omega$).

As will be appreciated from the below detailed description and accompanying drawings, in some implementations the reference data REF is spanned in the frequency domain $\{\omega\}$. Namely REF=$\{DS_{i,\omega}\}$ In this case the reference parametric EM field data $\vec{A}_i$ in each data set is also specific to a certain to wavefront's frequency $\omega$. In this case the reference parametric EM field data is $\vec{A}_i \rightarrow \vec{A}_{i,\omega}$ and is indicative of the frequency response of the vector sensor to an EM wavefront of that specific frequency propagating with the DOA and/or SOP of the corresponding reference steering vector parameters $\vec{S}_i$ of the respective data set. Thus, in this case the reference data REF is generally given by REF=$\{DS_{i,\omega}\}$=$\{[\vec{A}_{i,\omega}, \vec{S}_i]\}$. It should be understood that in cases where the reference data REF is spanned in the frequency domain $\{\omega\}$, the preprocessing of the measured parametric EM field data $\langle\vec{X}\rangle$ by preprocessor 110 further includes applying frequency filtering to the measured parametric EM field data $\langle\vec{X}\rangle$ according to an expected frequency of a signal of interest $\omega_0$ to obtain only the measured parametric EM field data $\langle\vec{X}\rangle_{\omega_0}$ oscillating at that frequency of interest. In this case the measured parametric EM field data $\langle\vec{X}\rangle_{\omega_0}$ may be a generalized vector of complex scalars presenting the amplitudes and phases of the vectorial components $[E_x, E_y, E_z, H_x, H_y, H_z]^{\omega_0}$ of the measured electric and magnetic fields which oscillate with the frequency of interest $\omega_0$: $\langle\vec{X}\rangle_{\omega_0}$=$[E_x, E_y, E_z, H_x, H_y, H_z]^{\omega_0}$. For instance, the samples of the parametric EM field components x'=$[E_x, E_y, E_z, H_x, H_y, H_z]^t$ measured by the vector sensor 10 at certain one or more time instances t may be processed/transformed (e.g. by Fourier Transform; or by digital down converter (DDC)) to the frequency domain and only the complex components in this domain pertaining to the frequency of interest we may be extracted to obtain $\langle\vec{X}\rangle_{\omega_0}$.

For example the measured parametric EM field $\langle\vec{X}\rangle_{\omega_0}$ per frequency of interest $\omega_0$ may be obtained by filtering the measured samples $\vec{x}_t$=$\vec{h}_e Sig_t$+$\vec{q}_t$ according to the frequency of interest $\omega_0$ to obtain $\vec{x}_t(\omega_0)$ and taking the Eigen vector of the covariance matrix Q=$\Sigma_t \vec{x(\omega_0)}_t \vec{x(\omega_0)}_t^H$, whose corresponding to the maximal Eigen value $\lambda$ $\langle \vec{X} \rangle_{\omega_0}$=EigenVector(Q)$|_{\lambda_{max}}$ In this regard it should be noted that generally the time dependency of the measurement is cancelled out in the covariance matrix Q (the covariance matrix is time independent).

Alternatively, or additionally, as will also be appreciated from the below detailed description and accompanying drawings, in some implementations the reference data REF is spanned in the time domain $\{\delta\}$. Namely REF=$\{DS_{i,\delta}\}$. In this case the reference parametric EM field data $\vec{A}_i$ in each data set is also specific to a certain temporal wavefront's form, characterized here by generalized parameter $\delta$, which presents a certain temporal response function (e.g. impulse response function) of the vector sensor to an EM wavefront of that specific certain temporal wavefront's form $\delta$ propagating with the DOA and/or SOP of the corresponding reference steering vector parameters $\vec{S}_i$ of the respective data set. For example, the reference data REF may include a plurality of data sets in which the reference parametric EM field data $\vec{A}_i$ presents the impulse responses of the vector sensor 10 to different pulse shaped EM waveforms where the parameter $\delta$ associated with each data set characterizes the temporal widths of the pules. E.g., in a dataset $DS_i$, $\delta$ may be the Full Width at Half Maximum (FWHM) parameter of the corresponding EM waveform, and the corresponding reference parametric EM field data $\vec{A}_i$ is the impulse response of the vector sensor 10 to such a pulsed waveform arriving with the respective properties (DOA and/or SOP) of the steering vector parameters $\vec{S}_i$ of the dataset $DS_i$. In this case the reference parametric EM field data indicative of the temporal response of vector sensor 10 to waveform with temporal parameter $\delta$ is a function of time $\vec{A}_i \rightarrow \vec{A}_{i,\delta}(t)$. Thus, in this case the reference data REF is generally given by REF=$\{DS_{i,\delta}\}$=$\{[\vec{A}_{i,\delta}(t),\vec{S}_i]\}$. It should be understood that in cases where the reference data REF is spanned in the time domain $\{\delta\}$, the measured parametric EM field data $\langle \vec{X} \rangle$ processed by the preprocessor 110 is maintained as a function of time $\langle \vec{X} \rangle$ (t). Thus in this case, for instance, the samples of the parametric EM field components $x^t$=$[E_x, E_y, E_z, H_x, H_y, H_z]^t$ measured by the vector sensor 10 at certain one or more time instances t may be used to present the developments/functions of the parametric EM field components in time: $\langle \vec{X} \rangle$(t)=$[E_x(t), E_y(t), E_z(t), H_x(t), H_y(t), H_z(t)]$. To this end, the preprocessing may be carried out for one time frame, or more generally in case the received waveform is repetitive (e.g. self-correlative in time) it may be carried out for a plurality of time frames, whereby per each time frame, a detection process is carried out to identify whether the measured parametric EM field component $x^t$ includes a measured signal of interest. Then the relevant time frames (e.g. including the signals of interest), in case of a plurality of time frames, may be respectively filtered (e.g. time aligned) and possibly summed to obtain a nominal measured parametric EM field data $\langle \vec{X} \rangle$(t). Otherwise, in case of using a signal time frame, the nominal measured parametric EM field data $\langle \vec{X} \rangle$(t) may be similar to the parametric EM field components $x^t$ obtained during the time frames. Nonetheless it should be noted that such time alignment may also be performed implicitly during the comparison/matching between the reference data and the measured parametric electric field—e.g. by calculating the correlation function between the reference parametric EM field data $\vec{A}_{i,\delta}(t+\Delta t)$ (being the temporal response of vector sensor 10) of one or more data sets, and the measured parametric EM field data $\langle \vec{X} \rangle$(t) thereby finding the maximal correlation between them for any plausible time lag $\Delta t$. The reference data REF stored in the repository 120 according to various embodiments of the present invention is described in further detail with reference to FIG. 2C below and with respect to the operation 220 of method 200.

System 100 additionally includes a comparison module 130 configured and operable for comparing/processing the measured parametric EM field data $\langle \vec{X} \rangle$ and the parametric EM field reference data $\vec{A}_i$ of one or more of the reference data sets $\{DS_i\}$ and determining a matching score between the measured parametric EM field data $\langle \vec{X} \rangle$ and each of the one or more of the reference data sets $\{DS_i\}$ being compared. The comparison module 130 methodology implemented here for finding one matching data set $DS_i$ or a plurality of matching data sets $\{DS_i\}$ (if any one or more matching data sets exist), may be different from embodiment to embodiment. The comparison module 130 may include a reference data provider 131 (also referred to herein interchangeably as data set estimator/looper module 131) configured and operable for connecting to the reference data repository 120 and estimating/looping to sequentially retrieve one or more relevant data set for which matching score is to be determined; a matching score calculator 132 connectable to the preprocessor 110 for receiving therefrom the measured parametric EM field data $\langle \vec{X} \rangle$ and to the reference data provider 131 (data set looper module 131) for receiving the parametric EM field reference data $\vec{A}_i$ of a relevant data set, and adapted for determining a matching score $BF_i$ between them; and a match analyzer 136 connectable to a threshold provider 134 for receiving therefrom a certain threshold condition TH, and determining, based on the respective matching scores, one or more data sets whose steering vectors' parameters are candidates "Candidates $\vec{S}_i$" for being representatives of the steering parameters (DOA and/or SOP) of the measured parametric EM field data $\langle \vec{X} \rangle$.

The relevant data sets to be possibly considered/looped by the dataset estimator/looper 131, may include all the data sets, or only the subset of data sets pertaining to the frequency of interest or to a certain temporal waveform shape(s)), and possibly also to predetermined/a priori known parameters of the measured EM field/waveform.

As indicated above, the reference parametric EM field data $\vec{A}_i$ in each data set may be represented as follows, where $F(\theta_i, \phi_i)$ represents the DOA dependency of the data sets and $\vec{g}(\gamma_i, \tau_i)$ represents the polarization dependency:

$$\vec{A}_i = \begin{bmatrix} \hat{E}_x \\ \hat{E}_y \\ \hat{E}_z \\ \hat{H}_x \\ \hat{H}_y \\ \hat{H}_s \end{bmatrix} = F(\theta_i, \phi_i)\vec{g}(\gamma_i, \tau_i)$$

Therefore, as the dependency on the DOA and on the polarization is separated, the reference data may not necessarily include 4 dimensional data spanning the entire DOA and SOP space $(\theta_i,\phi_i,\gamma_i,\tau_i)$, but may instead include separate data, separately spanning the DOA space and the polarization space. For example in the reference data, the DOA space $(\theta_i,\phi_i)$, may be represented by a 2D lookup table of F or an analytic representation/model of F, as described above, per two orthogonal polarizations. As for the polarization space $(\gamma_i,\tau_i)$ this may be represented by the function $\vec{g}(\gamma_i,\tau_i)$ described above which presents the linear combination of the two polarizations represented by F. In this way, the amount of reference data required may be reduced as compared to cases where the reference data includes a table presenting the full 4D space $(\theta_i,\phi_i,\gamma_i,\tau_i)$. Consequently, in case the reference data is presented/stored in the reduced way above, the dataset estimator/looper 131 may be configured and operable for determining the data sets per each steering vector parameters $(\theta_i,\phi_i,\gamma_i,\tau_i)$ based on the reference data given/stored for $F(\theta_i,\phi_i)$ and the reference data/analytic function $\vec{g}(\gamma_i,\tau_i)$: $\vec{A}_i = F(\theta_i,\phi_i)\vec{g}(\gamma_i,\tau_i)$.

In this connection, while looping or estimating the data-sets $\{DS_i\}$, the estimator/looper 131 may not necessarily loop/recur over all the possibilities in the 4D space $((\theta_i,\phi_i,\gamma_i,\tau_i))$ in brute force. In order to provide efficient processing/searching over the reference data, an initial starting point in the 4D space $((\theta_i,\phi_i,\gamma_i,\tau_i))$ can be estimated (e.g. analytically for example by obtaining the rough DOA based on Poynting vector calculations from the measurements $\langle\vec{X}\rangle$ and/or optionally also estimating the polarization, and/or based on prior knowledge (e.g. from other sources) regarding the properties of the expected signal, such as rough DOA or type of polarization (linear, circular)).

In this connection, it should be noted that according to some embodiments of the present invention, the estimator/looper 131 actually carries out only a two dimensional search (loop) over the relevant data sets (e.g. those being stored in the reference data memory or constructed based on the reference data $F(\theta_i,\phi_i), \vec{g}(\gamma_i,\tau_i)$ as described above). The 2D search/loop may be carried out only over the DOA space in case where the parametric EM field data $\vec{A}_i$ presented/indicated in the reference datasets are all normalized to a certain similar value $\vec{A}_{(\theta,\phi,\gamma,\tau)}^H \vec{A}_{(\theta,\phi,\gamma,\tau)} = $const. In such cases one can first estimate $\theta,\phi$ by finding the $\vec{F}_{(\theta,\phi)}$ that maximizes the largest Eigenvalue of the matrix $\vec{F}_{(\theta,\phi)}^H Q \vec{F}_{(\theta,\phi)}$, and the matching Eigenvector is $\vec{g}(\gamma,\tau)$, where Q is the covariance matrix of the measurements $\langle\vec{X}\rangle$.

Thus, in some embodiments, the estimator/looper 131 is configured and operable for estimating and looping over all of the 4D space parameters $(\theta_i,\phi_i,\gamma_i,\tau_i)$ of the steering vectors' parameters $\vec{S}_i$ in the datasets until the best/highest matching score(s) is found by the Matching Score Calculator. Alternatively or additionally, in some implementations the estimator/looper 131 is configured and operable for estimating and looping over a subset of the datasets which are in the vicinity of a certain a priori determined starting point in the 4D space parameters $(\theta_i,\phi_i,\gamma_i,\tau_i)$ of the steering vectors' parameters $\vec{S}_i$, thus saving processing time. Yet alternatively or additionally, in some implementations where parametric EM field data $\vec{A}_i$ in the reference data are all normalized to a certain similar value, the estimator/looper 131 may be adapted to carry out only a 2D search over the reference data sets.

As said above, methodology implemented by the comparison module 130 for finding one matching data set $DS_i$ (candidate) or a plurality of matching data sets $\{DS_i\}$ (candidates), may be different from embodiment to embodiment. For instance, in some embodiments the looper module 131 may loop over all of the relevant data sets in the reference data, retrieve each relevant data set from the reference data repository 120, such that comparison module 130 determines the matching score between measured parametric EM field data $\langle\vec{X}\rangle$ and the parametric EM field reference data $\vec{A}_i$ of each of the relevant data sets, and the match analyzer 136 selects the one or more datasets for which the matching score is maximal and satisfies a certain threshold condition that is given by the threshold provider 134, as candidates for representing the measured EM field $\langle\vec{X}\rangle$. In some embodiments the match analyzer 136 selects only one candidate data set whose matching score is the highest and satisfies the threshold condition. In some embodiments several candidate data sets satisfying the threshold condition may be selected. In the latter case resolving which of these candidates actually represents the parametric EM field data $\langle\vec{X}\rangle$ may be resolved by other means (e.g. by location systems and/or spectral analysis systems and/or beam-forming/phased array systems receiving the DOAs and/or SOPs of the plurality of candidate data sets and independently determining their match to signals independently sensed by such systems). In another methodology, the looper module 131 loops over the relevant data sets (e.g. one by one) until the match analyzer 136 finds a candidate data set for which the matching score between the parametric EM field reference data $\vec{A}_i$ and the measured parametric EM field data $\langle\vec{X}\rangle$ satisfies the threshold condition. Thus, the match analyzer 136 outputs candidate data indicative of one or more candidate datasets, or one or more steering vectors' parameters associated with such one or more candidate datasets, for which the threshold condition is satisfied, or the candidate data indicates that no candidate datasets are found. In this regard it should be understood that in some implementations in case a priori knowledge about the expected steering parameters of the measured parametric EM field data $\langle\vec{X}\rangle$ is known (e.g. rough DOA and/or SOP properties), then the match analyzer 136 may file out from the candidate datasets, those candidates whose steering parameters mismatch prior knowledge about the expected steering parameters.

To this end, system 100 may optionally also include an interference/steering estimator 140 connectable to the comparison module 130 (e.g. to the match analyzer 136) for receiving the candidate data. Interference/Steering Estimator 140 may include an Interference Estimator module 142 that processes the candidate data "Candidates $\vec{S}_i$," and in case the candidate data does not include any candidate steering vectors' parameters/data sets, the Interference Estimator module 142 determines that the measured parametric EM field data $\langle\vec{X}\rangle$, corresponds to the sensing of the interfered electromagnetic field by the vector sensors (e.g. an electromagnetic field suffering from multipath artifacts of other harsh interference conditions).

In this regard, it is noted that often interference and/or multipath effects are sporadic (namely, they are not temporally and/or spatially stable) and may exist at one instant/period of time in the EM field at the location of the vector sensor as a result of multiple interfering wavefronts, while at the next moment in time, or in a close by location, interference/multipath effects may not exist. Therefore in some embodiments the system 100 (e.g. Interference/Steering Estimator 140) includes a measurement repeater module 143 that is adapted to receive data indicative of the detected interference conditions from the interference estimator module 142, and optionally in case such conditions are detected, operate the system 100 for repeating the operation for an additional one or more time periods in an attempt to determine the direction of arrival (DOA) and possibly state of polarization (SOP) of the electromagnetic wavefront at these additional time periods (in case no interference conditions will be present at least one of these periods).

Figure 3B:
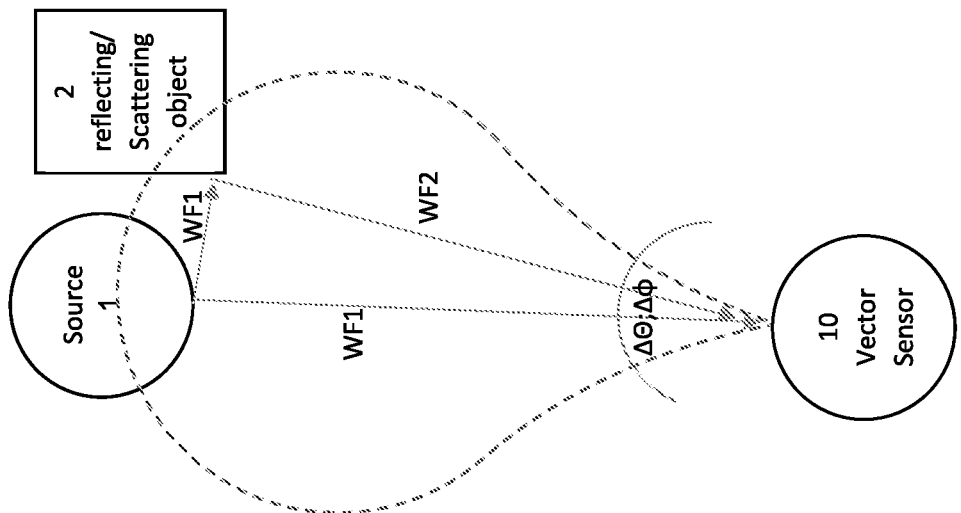
FIGS. 3A and 3B are schematic illustrations of two examples of multipath scenarios that can be identified according to various embodiments of the present invention, whereby in both the examples a signal/waveform is shown to propagate from a signal source 1 to a vector sensor 10 directly WF1 as well as indirectly WF2 via a scattering/reflecting object 2 (whereby in the example of FIG. 3A the scattering/reflecting object 2 resides relatively close to the vector sensor, and in the example of FIG. 3B the scattering/reflecting object 2 resides relatively close to the signal source)
Figure 3A:
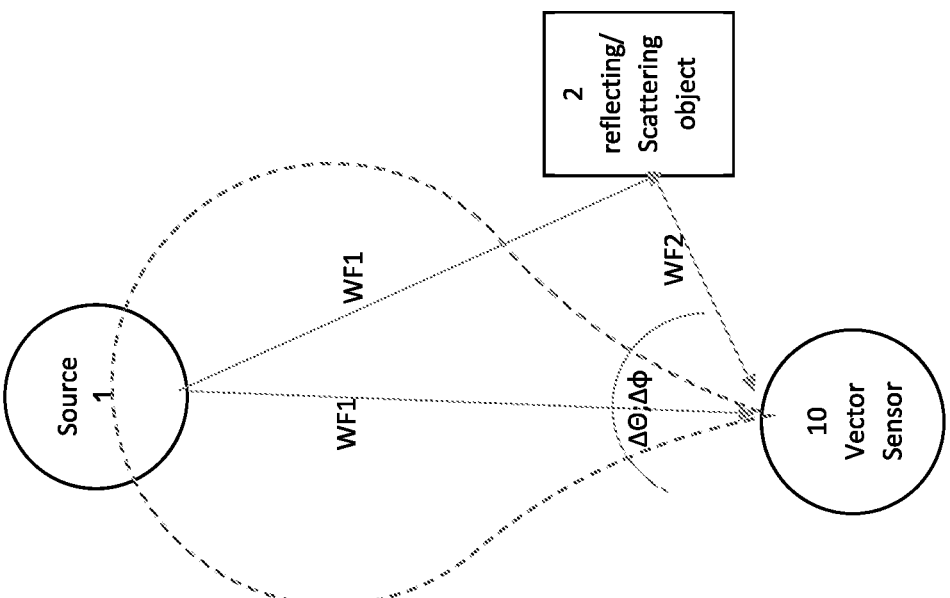

In this regard, referring to FIGS. 3A, a signal/waveform from a signal source 1 propagating to the vector sensor 10 directly WF1, and indirectly WF2 via a scattering/reflecting object 2, is shown. In cases where the scattering object 2 is relative proximate to the vector sensor 10 and far from the signal source 1 (as shown in FIG. 3A), the direct signal/waveform WF1 and the reflected/scattered signal/waveform WF2 arrive at the vector sensor at substantially different DOAs, whereby the angular difference between their DOAs, $\Delta\Theta;\Delta\varphi$, may be larger than the angular resolution (beam lobe widths) of the vector sensor 10. In this case the matching scores of the waveform sensed by the vector sensor may be low, and no candidate data set may be found to match the sensed/measured EM waveform, as its multipath represents sufficiently distinct DOAs. Accordingly, in this case no candidate data sets may be found and the interference estimator module 142 may conclude/estimate that interference exists.

In case the candidate data includes one or more candidates, the interference estimator 140 determines that the measured parametric EM field data $\langle \vec{X} \rangle$ is highly likely to represent a sensing/measurement of a single wavefront by the vector sensor 10 and thus the candidate data may be passed for estimation of the DOA and/or SOP parameters of the single waveform by the DOA/SOP estimator module 144 of the interference/steering estimator 140.

Optionally, in some embodiments of the present invention, particularly in cases where the angular resolution of the vector sensor 10 is relatively low (namely its lobe width $\Delta\Theta;\Delta\varphi$ is relatively wide), there may exist one or more candidate datasets whose matching score is relatively high (e.g. above the threshold) even in case of multipath conditions. This may be for instance the case in the example illustrated in FIG. 3B, in which the signal/waveform from the signal source 1 propagates to the vector sensor 10 directly WF1, and indirectly WF2 via a scattering/reflecting object 2 that resides in relative proximity to the signal source 1 and relatively far from the vector sensor 10 so that the direct signal/waveform WF1 and the reflected/scattered signal/waveform WF2 arrive at the vector sensor at relatively similar DOAs, whereby the angular difference between their DOAs, is smaller than the angular resolution $\Delta\Theta;\Delta\varphi$ (beam lobe widths) of the vector sensor 10. In this case, candidate datasets, whose matching score is relatively high, may be found even in multipath conditions, simply because the angular resolution of the vector sensor 10 is low. To this end, the measured parametric EM field <X> resulting from the sum of the wavefronts of the multipath waveforms, WF1 and WF2, as sensed by the vector sensor 10, can be estimated/matched to candidate data set having polarization different than those of the interfering waveforms WF1 and WF2 (for example whereby WF1 and WF2 may have different linear polarizations), the measured parametric EM field <X> may be indicative of circular/elliptical polarization. Thus in some embodiments of the present invention the system (e.g. the interference estimator 140) also includes an optional filtration module 141, also referred to herein below as state of polarization (SOP) filter module 141, configured and operable for applying further filtration to the candidate datasets based on prior data on the polarization properties of the signal source 1. The optional SOP filter module 141, may be configured and operable carry out operation 241 of method 200, so as to obtain data about the properties of the signal source, particular indicative of its polarization properties-whether it is linear or circular etc., and in case the steering vector parameters of one or more of the candidate data sets are associated with different polarization properties (different from the source), these datasets are removed from the "list" of candidate datasets. Also here, in case no candidate data-sets remain, the SOP filter module 141 determines that the measured parametric EM field <X> pertains to multipath conditions. In this case, optionally in some embodiments (as shown in operation 243), the operations of method 200 may be repeated for an additional one or more times (e.g. until a measured parametric EM field data $\langle \vec{X} \rangle$ not associated with interference conditions, is obtained).

Thus in case after the optional operation of module 141, the candidate data includes one or more candidates, it may be determined that the measured parametric EM field data $\langle \vec{X} \rangle$ is highly likely to represent a sensing/measurement of a single wavefront by the vector sensor 10. Optionally, the candidate data may be passed for estimation of the DOA and/or SOP parameters of the single waveform by the DOA/SOP estimator module 144 of the interference/steering estimator 140.

In turn, in case/embodiment(s) where the candidate data is indicative of only a single candidate data set, or its respective steering vector parameters, the interference/steering estimator 140 outputs that steering vector parameters as representing the DOA/SOP of the measured parametric EM field data $\langle \vec{X} \rangle$. Otherwise, in case/embodiment(s) where the candidate data may be indicative of a plurality of candidate data sets, or their respective plurality of steering vectors' parameters, the interference/steering estimator 140 may either output the respective plurality of steering vectors' parameters as possible representations of the DOA/SOP of the measured parametric EM field data $\langle \vec{X} \rangle$, or it may connect to additional signal processing systems (e.g. external beam former resolver 150) which may utilize additional data/measurements of the electromagnetic field that had been measured by the vector sensor to further resolve, from the plurality of candidate data sets, a single one that is most likely representative of the parametric EM field data $\langle \vec{X} \rangle$ DOA/SOP of the measured parametric EM field data $\langle \vec{X} \rangle$. This resolving may be based on the spatial discrimination of the electromagnetic field propagation direction that may be obtained by a phased array system 150 under the assumption (verified by the interference estimator 142) that the EM field is not interfered and represents a single wavefront. In this connection it is noted that generally in cases where multiple candidates exist, the filtering performed by the system 100, in high probability, filters out candidates whose DOAs are associated with similar angular orientations. Accordingly, conventional phased array-based beam forming systems may generally have the sufficient angular resolution to resolve between the different candidate steering vectors' parameters that are obtained by system 100.

Referring now together to FIGS. 2B to 2D, a method 200, which may be implemented by the system 100, for determining whether an EM field sensed by the vector sensor is the product of interfering wavefronts (e.g. resulting from multipath or other interference conditions), and in case not, estimating the DOA/SOP of the EM field by the vector sensor, will now be explained in more detail. Method 200 includes the following sub-methods/operations:

Operation 210, which is illustrated specifically in FIG. 2B includes the provision/measurement of the measured parametric EM field data $\langle \vec{X} \rangle$ indicative of measured vector components of electric and magnetic fields as those are measured at a certain location and at/during one or more time instances/frames;

Sub-method/Operation 220, which is illustrated in FIG. 2C, includes the provision/computation/measurement of the reference data REF. The reference data REF includes a plurality of reference data sets REF={$DS_i$}, each data set $DS_i$ includes a reference steering vector parameters $\vec{S}_i$ indicative of at least a certain respective direction of arrival, $\vec{S}_i = [\theta_i, \varphi_i]$, and the corresponding reference parametric EM field data $\vec{A}_i = [\hat{E}E_x^i\ \hat{E}E_y^i\ \hat{E}E_z^i\ \hat{H}H_x^i\ \hat{H}H_y^i\ \hat{H}H_z^i]$ including components of electric and magnetic fields of an EM wavefront (indexed i) propagating with DOA and possibly SOP corresponding to the reference steering vector parameters $\vec{S}_i$. As indicated above, the reference parametric EM field data $\vec{A}_i$ may be considered as representing the response (e.g. output signals) of the vector sensor 10 outputted in response to an EM wavefront propagating with DOA and/or SOP corresponding to the reference steering vector parameters $\vec{S}_i$. It is understood that the reference parametric EM field data $\vec{A}_i$ may actually represent the expected output signals of the vector sensor 10, after the latter, in case needed, are possibly aligned and/or transformed and/or scaled to a certain six dimensional space of the vector space of representing the three orthogonal components of the electric field and the three orthogonal components of the magnetic field (e.g. such alignment and/or transformation and/or scaling may be needed for instance in case the electric and/or magnetic antenna elements of the vector sensor are not aligned with respect to Cartesian coordinates, or the output signals (e.g. from their feeding ports) are not scaled). Thus, REF={$DS_i$}={[$\vec{A}_i, \vec{S}_i$]}.

Sub-method/operation 230, which is illustrated in FIG. 2D, includes determining matching score(s) $BF_i$ between the measured parametric EM field data $\langle \vec{X} \rangle$ and the reference parametric EM field data $\vec{A}_i$ of one or more of the reference data sets {$DS_i$}, and, based on the matching scores, determining whether the steering vectors' parameters $\vec{S}_i$ of one or more data sets $DS_i$ are candidates for being indicative of the DOA and/or SOP parameters of the measured parametric EM field data $\langle \vec{X} \rangle$. The matching score may be obtained by computing the inner product (e.g. generalized inner product or simple inner product) and/or by computing the correlation between the measured parametric EM field data $\langle \vec{X} \rangle$ and the reference parametric EM field data.

Then in sub-method/operation 240, which is also illustrated specifically in FIG. 2D, the candidate data sets $DS_i$ are processed to determine whether the measured parametric EM field data $\langle \vec{X} \rangle$ represents interference conditions, such as multipath, or otherwise determine/estimate the DOA and/or SOP parameters of the measured parametric EM field data $\langle \vec{X} \rangle$.

Turning now more specifically to operation 210, the following should be noted:

Operation 212 includes obtain the parametric EM field data $\langle \vec{X} \rangle$ and may optionally be obtained by measuring/sampling the vectorial components $\vec{x}^t = [E_x, E_y, E_z, H_x, H_y, H_z]^t$ of the electric and magnetic fields at one or more time instances t. As clarified in 214, in some embodiments the parametric EM field data $\langle \vec{X} \rangle$ to be measured/obtained in 210 should represent the vector components of electric and magnetic fields as those are measured by a vector sensor (e.g. of a certain type) that is positioned at a certain location. Accordingly in 212 the lower case $\vec{x}^t$ represents a single set of samples of the electric and magnetic field components obtained at particular time point t: $\vec{x}^t = [E_x, E_y, E_z, H_x, H_y, H_z]^t$. Generally/typically a plurality of such sets of samples are acquired/obtained from the vector sensor during one or more time frames (indexed frm) including several sampling time points (e.g. $t_1, t_2, t_3, \ldots$) at which a set of samples $\vec{x}^t$ of the electric and magnetic field is measured/sampled by the vector sensor.

Thus, for each time frame frm, the electric and magnetic fields are measured/obtained as a function of time (e.g. in digital/analog representation) as follows: $\vec{X}_{frm}(t) = [E_x(t), E_y(t), E_z(t), H_x(t), H_y(t), H_z(t)]$. This can be performed for one or more time instances (e.g. for one or more time frames of certain durations extending about the one or more time instances.

Then, optionally, preprocessing operation 216 may be performed on the measured/sampled vector components of the electric and magnetic fields. The type of preprocessing, carried out at this stage, depends on which embodiment/implementation of the present invention is performed, namely whether the technique of the present invention is implemented in the frequency domain, or in the time domain.

Indeed, in the frequency domain, implementations/embodiments of the present invention, optional operation 216.2 may be carried out in order to extract the parts of the measured electric and magnetic fields pertaining to some particular frequency of interest wo, from the electric and magnetic field components $\vec{X}_{frm}(t)$ that are measured as a function of time during the one or more time frames frm. As will be appreciated by those versed in the art considering the technique disclosed herein, operating in the frequency domain may be conveniently used in particular when the DOA and/or SOP of a certain relatively narrow band wavefront are to be determined. In this case, applying operation 216.2 provides for filtering out the components of the sensed/measured EM field which are not in the frequency of interest $\omega_0$, and thus determining whether harsh interference/multipath conditions exist only for that part of the EM field which oscillates at the frequency of interest $\omega_0$.

Thus, in this case operation 216.2, which is carried out, includes providing frequency of interest $\omega_0$ for which it is to be determined whether there exist harsh interference conditions exist or not, and in the latter case (where no or not harsh interference conditions exist), the DOA and/or SOP of the wavefront in that frequency may be estimated. 216.2 includes determining, per each time frame frm measurements $\vec{X}_{frm}(t)$, the amplitudes and phases of the vector components of the measured electric and magnetic fields oscillating at the frequency of interest $\omega_0$—namely: $\vec{X}_{frm}(\omega_0)$. This may be achieved for instance by converting the parametric EM field data $\vec{X}_{frm}(t)$ of the time frame to frequency representation $\vec{X}_{frm}(\omega)$ (e.g. using Fourier Transform or similar transform or otherwise any other suitable narrow band filtration about $\omega_0$) and extracting therefrom the amplitude and phase $\vec{X}_{frm} = \vec{X}_{frm}(\omega_0)$ of the frequency of interest $\omega_0$ (whereby here $\vec{X}_{frm}(\omega_0)$ is a generalized vector of complex numbers representing both the amplitude and the phase for each of the EM field components $[E_x, E_y, E_z, H_x, H_y, H_z]^{\omega_0}$.

Then, optionally, in case the parametric EM field data $\vec{X}_{frm}(t)$ is obtained for a plurality of time frames frm, an accurate estimation of the parametric EM field in the frequency of interest may be obtained by carrying out operation 218 to average over $\vec{X}_{frm}(\omega_0)$ that is obtained for the plurality of time frames: $\langle \vec{X} \rangle = \text{Average} (\vec{X}_{frm})$. This may be, for example performed in the frequency domain implementation/embodiment by implementing operation 218.2 as follows: $\langle \vec{X} \rangle \equiv \langle \vec{X} \rangle|_{\omega_0} = \langle \vec{X}_{frm}(\omega_0) \rangle_{frm}$.

Alternatively, or additionally, in time domain implementations/embodiments of the present invention, optional operation 216.6 may optionally be carried out. It should be noted that time domain implementations of the present invention allow analysis of the interference conditions at which a broad band signal (such as a narrow temporal pulse) is measured/sensed by the vector sensor, and in case no harsh interference conditions are found, estimating the DOA and/or SOP of such broadband signals. Actually, in this case, typically there may be no particular advantage for measuring the plurality of time frames frm of the EM field, but a single time frame long enough to include the temporal signal/waveform transmitted by the emitter may suffice in order to determine accurately whether a temporal signal/waveform sensed by the vector sensor (i.e. the measured parametric EM field) was subjected to interference/multipath conditions. Thus, in case of only a single time frame, operation 216.6 may be skipped/obviated, as well as the operation 218 (e.g. operation 218.4 may be implemented according to which the measured parametric EM field $\langle \vec{X} \rangle \equiv \vec{X}_{frm}(t)$ is similar to the measurements obtained during the time frame).

However, for example in case the emitter of the temporal signal/waveform repeatedly transmits the similar waveform shape, in such cases sensing/measuring the parametric EM field, $\vec{X}_{frm}(t)$ of the signal received by the vector sensor during a plurality of time frames, at which this similar waveform's shape is received, may further be used to improve the accuracy of the determination of whether or not the received signal suffers from interference/multipath effects or not, and/or for estimation of the DOA/SOP of the received signal. However, in such cases (namely when operating in the time domain and also measuring the parametric EM field $\vec{X}_{frm}(t)$ during a plurality of time frames), operation 216.6 may be carried out prior to operation 218, in order to respectively filter/temporarily align the parametric EM fields $\vec{X}_{frm}(t)$ measured in the plurality of time frames, so that the waveform shapes of interest included therein would be aligned. To this end, in case of more than one time frame, operation 216.6 may include applying temporal alignment to the parametric EM fields $\vec{X}_{frm}(t)$ obtained during the different time frames with respect to one another. Presuming the signal of interest (e.g. being the signal from the emitter) is predominant in the received parametric EM fields $\vec{X}_{frm}(t)$, such alignment may be determined by calculating the correlation between parametric EM fields $\vec{X}_{frm}(t)$ of two or more frames to determine a relative time delay(s) between them at which the correlation is maximal, and then shifting one or more of the parametric EM fields $\vec{X}_{frm}(t)$ of the different frames according to the found delays so as to maximize the overlap/correlation between them. In a particular example this may be achieved by selecting (e.g. arbitrarily) one of the time frames to serve as a reference frame rfrm and applying time delay/shift to each of the other time frames, such that its parametric EM field data $\vec{X}_{frm}(t)$ has maximal correlation with the parametric EM field data $\vec{X}_{frm}(t)$ of the selected reference frame rfrm.

Thus, once aligned, operation 218 may be carried out in order to average the aligned parametric EM fields $\vec{X}_{frm}(t)$ and obtain the average parametric EM field as a function of time. This may be for example implemented by carrying out the operation 218.6 as follows: $\langle \vec{X} \rangle \equiv \langle \vec{X} \rangle (t) = \langle \vec{X}_{frm}(t) \rangle_{frm}$.

In optional operation 219 electric field components and the magnetic field components of the parametric EM field $\langle \vec{X} \rangle$ obtained from the one or more time frame measurements may be further normalized (e.g. such that: $\langle \vec{X} \rangle = [\hat{E}_x \ \hat{E}_y \ \hat{E}_z \ \hat{H}_x \ \hat{H}_y \ \hat{H}_z]$). It should be noted that this operation is indeed optional as the reference parametric EM field data $\vec{A}_i$ in the different data sets are generally also normalized, and therefore, in this case, accurate results would be obtained, even if the measured parametric EM field $\langle \vec{X} \rangle$ is not normalized.

Turning now to FIG. 2C, operation 220 of providing the reference data REF, is now described in more detail. As indicated above, the reference data REF includes a plurality of reference data sets REF={$DS_i$} whereby each data set $DS_i$ includes a reference steering vector parameters $\vec{S}_i$ indicative of at least a certain respective direction of arrival, $\vec{S}_i = [\theta_i, \phi_i]$, and the corresponding reference parametric EM field data $\vec{A}_i = [\hat{E}E_x^i \ \hat{E}E_y^i \ \hat{E}E_z^i \ \hat{H}H_x^i \ \hat{H}H_y^i \ \hat{H}H_z^i]$.

Optional operation 221 indicates that the reference parametric EM field data $\vec{A}_i$ of each reference data set $DS_i$ being provided in the reference data REF, is preferably normalized. More specifically, in some implementations of the present invention, the reference parametric EM field data $\vec{A}$ presents the normalized electric field vector components and the normalized magnetic field vector components as would be measured by a vector sensor (e.g. of a certain particular type) in case an EM wavefront (indexed i) propagating with parameters of the reference steering vector parameters $\vec{S}_i$ impinges the vector sensor. This provides that the results of matching between the measured parametric EM field $\langle \vec{X} \rangle$ and different reference parametric EM field data $\vec{A}$ are co-scaled (are similarly scaled) and thus can be compared to accurately determine the reference parametric EM field data $\vec{A}$ (and corresponding data set $DS_i$ or steering vector parameters $\vec{S}_i$) which best matches the measured parametric EM field $\langle \vec{X} \rangle$.

As indicated in optional operation 222 the reference steering vector parameters $\vec{S}_i$ in each data set $DS_i$ being provided, may also include reference State of Polarization (SOP) parameters, $\gamma_i, \tau_i$ indicative of a certain respective SOP of the corresponding reference parametric EM field data $\vec{A}_i$ in the respective data set. Thus the complete steering vector parameters per each reference parametric EM field data $\vec{A}_i$ may be given as $\vec{S}_i=[\theta_i,\phi_i,\gamma_i,\tau_i]$ (where $\gamma_i, \tau_i$ are tilt and phase lag of cardinal polarization components and i spans a plurality of pairs of DOAs & SOPs of interest).

In this regard, it should be noted that embodiments of the present invention in which the steering vector parameters $\vec{S}_i=[\theta_i,\theta_i,\gamma_i,\tau_i]$ of the data set $DS_i$ includes the State of Polarization (SOP) parameters, $\gamma_i, \tau_i$, (in addition to the DOA parameters $\theta_i, \phi_i$) were found by the inventors of the present invention to provide better and more accurate/reliable results for estimating/determining whether an EM field sensed/measured by the vector sensor is subjected to (or is the product of) harsh interference/multipath conditions or not. This is because in case the data sets pertain to complete steering vectors' parameters $\vec{S}_i=[\theta_i,\phi_i,\gamma_i,\tau_i]$, the respective reference parametric EM field data $\vec{A}_i$ in the data sets are also specific to the complete steering vectors' parameters of the respective data set $DS_i$. Accordingly, in case a match is found between the measured parametric EM field data $\langle \vec{X} \rangle$ and a parametric EM field data $\vec{A}_i$ that is specific to the complete steering vector parameters including both DOA and SOP parameters, such a match provides much more reliable indication (higher probability) that the measured parametric EM field $\langle \vec{X} \rangle$ has the steering vector parameters properties $\vec{S}_i=[\theta_i,\phi_i,\gamma_i,\tau_i]$, as compared to the case where the parametric EM field $\vec{A}_i$ is not specific to the complete steering vector parameters, but is actually indicative of the nominal parametric EM field $\vec{A}_i$ components for signal of any polarization arriving from certain DOA indicated by the steering vector parameters.

Optional operation 223 includes providing the reference parametric EM field data $\vec{A}_i$ of the respective reference data sets $DS_i$. As indicated above, the reference parametric EM field data $\vec{A}_i$ in each reference data set $DS_i$, represents a generalized vector of the sensing of an EM field waveform having the corresponding steering parameters $\vec{S}_i$ by the vector sensor. It should be noted that in some embodiments, the reference parametric EM field data $\vec{A}_i$ of the respective reference data sets $\{DS_i\}$ is a priori determined (e.g. measured/calculated) and stored in the reference data repository 120. Alternatively or additionally, in some embodiments the reference parametric EM field data $\vec{A}_i$ for the data sets $\{DS_i\}$, or some of them, may be computed in real time, during operation of the system 100 (e.g. based on an analytical model of the vector sensor 10 and optionally of objects in its vicinity), and the respective steering vectors' parameters of the data sets $\{DS_i\}$.

In this connection, it should be understood that the reference data REF may be stored in the form of a lookup table and/or a model by which including all the datasets of interest can be determined/obtained (e.g. based on their steering parameters $\theta,\phi,\gamma,\tau$). In this case the data set looper module 131 actually retrieves the relevant data sets (e.g. those pertaining to steering vectors' parameters of interest) from the lookup table in the repository 120.

Additionally or alternatively, the stored reference data may include a stored model (e.g. indicative of the response/distortion matrix Di characterizing the response of the vector sensor 10 to the EM field of different steering vector properties (of different DOAs and/or different SOPs), and possibly also characterizing the distortions applied to such EM fields by the presence of objects (e.g. metallic objects) in the vicinity of the vector sensor 10 (in case accurate processing should be obtained for vector sensor 10 that is positioned at a predetermined location or on a predetermined platform introducing various distortions/warping to electric fields propagating nearby). In this case, the data set looper module 131 may actually be configured and operable to compute the reference parametric EM field data $\vec{A}_i$ of the relevant data sets (e.g. those pertaining to steering vectors' parameters of interest) based on an analytic model including the response/distortion matrix $D_i$ of the vector sensor (e.g. matrix of size 6×6).

The analytic model may be for example given as:

$$\vec{A}_i = \left[\hat{E}_x^i\ \hat{E}_y^i\ \hat{E}_z^i\ \hat{H}_x^i\ \hat{H}_y^i\ \hat{H}_z^i\right]$$
$$= [D_i][DOA_i][SOP_i]$$
$$= [Di] \overbrace{\begin{bmatrix} \cos\theta\cos\phi & -\sin\phi \\ \cos\theta\sin\phi & \cos\phi \\ -\sin\theta & 0 \\ \sin\phi & \cos\theta\cos\phi \\ -\cos\phi & \cos\theta\sin\phi \\ 0 & -\sin\theta \end{bmatrix}}^{F(\theta,\phi)} \overbrace{\begin{bmatrix} \sin\tau e^{j\gamma} \\ \cos\tau \end{bmatrix}}^{g(\gamma,\tau)}$$

where $[D_i]$ is the response/distortion matrix (e.g. which may be determined empirically or estimated analytically), $\theta$, $\phi$, $\gamma$, $\tau$ are the DOA and SOP parameters of the respective steering vector parameters $\vec{S}_i=[\theta_i,\phi_i,\gamma_i,\tau_i]$ for which the respective reference parametric EM field data $\vec{A}_i$ is computed, $[DOA_i]$ is a generalized rotation matrix associated with the DOA parameters of the reference parametric EM field $\theta_i,\phi_i$; and $[SOP_i]$ is a matrics representing the SOP $(\gamma_i,\tau_i)$ of the reference parametric EM field $\vec{A}_i$.

To this end, as indicated in optional operation 223.1, the parametric EM field data $\vec{A}_i$ may be computed/provided, in real time (e.g. during the operation of system 100) or a priori (e.g. during the manufacturing/calibration of the system 100), based on the above indicated analytic model $\vec{A}_i=[D_i][DOA_i][SOP_i]$. The response/distortion matrix $D_i$ characterizing the response and optionally EM distortions that would be applied to the sensing of EM field waveform with steering vector parameters St may be empirically measured or analytically estimated, and may be particular to a certain type/model of a vector sensor and/or optionally to a certain location/platform at which it is positioned, or in some cases may suit various vector sensors. In an ideal case, where the response function of the vector sensor 10 is substantially flat (in the spectral/temporal regime of interest and there are no significant distortions that are applied to the EM field by the vector sensor or objects in its vicinity, the response/distortion matrix $D_i$ is unity. The $[DOA_i]$ and $[SOP_i]$ matrices are generally mathematical entities typically independent of the vector sensor's type or location.

Alternatively, or additionally, as indicated in optional operation 223.3, the parametric EM field data $\vec{A}_i$ may be provided/computed based on results of empirical measurements performed (e.g. a priori) on the vector sensor 10 (e.g. when the vector sensor is placed at a designated location/platform of interest). For instance the response of the vector sensor to EM fields characterized by various steering vectors' parameters $\{\vec{S}_i\}$ and optionally the EM distortions that would be applied to the sensing of such EM fields by the vector sensor itself and/or by objects in its vicinity, may be determined/measured empirically by "bombarding" the vector sensor (e.g. sequentially) by the different EM fields characterized by steering vector parameters $\vec{S}_i$ and measuring its response (its output signals—e.g. from the feeding ports of its antenna elements) to the different EM fields. In this connection, the output signals of the vector sensor may represent the parametric EM field data $\vec{A}_i$. Moreover the response/distortion matrices $D_i$ of the vector sensor 10 to the different EM fields may also be determined empirically noting that a bombarding EM field characterized by steering vector parameters $\vec{S}_i$ may be represented by the above described matrices $[DOA_i][SOP_i]$. Accordingly the response/distortion matrices $D_i$ for a given bombarding EM field with steering vector parameters $\vec{S}_i$ and given resulting/measured output $\vec{A}_i$ of the vector sensor may be determined empirically by solving the equation: $\vec{A}_i=[D_i][DOA_i][SOP_i]$.

It should be noted that according to optional operation 224.2, the reference parametric EM field data $\vec{A}_i$ in the reference data sets is provided/computed such that the reference data sets $\{DS_i\}$ are spanned over the frequency domain. In other words, the reference data is such that one or more reference data sets $\{DS_i\}$ characterize the response of the vector sensor to a certain respective frequency $\{\omega\}$. In this case it should be noted that the dependency of the vector sensor's response to EM fields of different frequencies may be actually represented as the dependence of the response/distortion matrices $[D_i] \rightarrow [D_{i,\omega}]$ on the frequency $\omega$. Accordingly, by determining/providing (e.g. empirically in the manner indicated in 223.3, or analytically in the manner indicated in 223.1) the response/distortion matrices $[D_{i,\omega}]$ of the vector sensor for EM fields of different frequencies and different steering vectors' parameters, the corresponding reference parametric EM field data $\vec{A}_i \rightarrow \vec{A}_{i,\omega}$ for different frequencies may be obtained (computed/provided). Analytic determination of the reference data in this case, as in 223.1, may be achieved by computing a model of the vector sensor and/or objects in its vicinity, which affect the propagation of EM fields of different frequencies and different steering vectors' parameters. Empiric determination of the reference data, as in 223.3, may be achieved by bombarding the vector sensor with EM fields of different frequencies and measuring its output parametric EM field data $\vec{A}_{i,\omega}$ in response to each frequency.

Alternatively, or additionally, it should be noted that according to optional operation 224.6, the reference parametric EM field data $\vec{A}_i$ in the reference data sets may be provided/computed such that the reference data sets $\{DS_i\}$ are spanned over the time domain. In other words, the reference data is such that one or more reference data sets $\{DS_i\}$ characterize the response of the vector sensor to wavefronts of certain respective temporal shapes (the different temporal shapes are indicated here by the generalized parameter(s) $\delta$ characterizing a certain temporal waveform shape. For instance, the waveform shapes considered may be different pulses characterized by different widths (where in this particular example $\delta$ may be just a single parameter indicative of the FWHM characteristic of the pulse). In this case the dependency of the vector sensor's response to EM fields of different temporal shapes may be actually represented as the dependence of the response/distortion matrices $[D_i] \rightarrow [D_{i,\delta}]$ on the temporal shape parameter(s) $\delta$. Accordingly, by determining/providing (e.g. empirically in the manner indicated in 223.3, or analytically in the manner indicated in 223.1) the response/distortion matrices $[D_{i,\delta}]$ of the vector sensor to EM fields of different temporal shapes $\delta$ and different steering vectors' parameters, the corresponding reference parametric EM field data $\vec{A}_i \rightarrow \vec{A}_{i,\delta}(t)$ for different temporal shapes may be obtained (computed/provided). In analytic determination, as in 223.1, this may be achieved by computing a model of the vector sensor and/or objects in its vicinity and how those affect the propagation of EM fields with different temporal shapes arriving with different steering vector parameters properties). In empiric determination, as in 223.3, this may be achieved by bombarding the vector sensor with EM fields of different temporal shapes and different directions and/or polarization and measuring its output parametric EM field data $\vec{A}_{i,\delta}$ in response to each temporal shape and steering vector properties (indicating the direction and/or polarization). Moreover, it should be noted that in case where spanning the reference data in the time domain as described above, the reference parametric EM field that is acquired, should generally include data indicative of the development of the reference parametric EM field in time $\vec{A}_{i,\delta}(t)$ (namely it should be provided/computed/stored as a function of time or as a time series indicative of the development of vector sensor's output in time in response to an applied EM field of corresponding temporal shape $\delta$). In this connection it should be noted that analytic determination of the reference data, as in 223.1, may be achieved by computing a model of the vector sensor and/or objects in its vicinity and how those affect the propagation of EM fields with different temporal shapes $\delta$ and different steering vectors' parameters. Empiric determination of the reference data, as in 223.3, may be achieved by bombarding the vector sensor with EM fields of different temporal shapes and measuring its output parametric EM field data $\vec{A}_{i,\delta}$ in response to temporal shape as a function of time.

Turning now to FIG. 2D, this illustrates a flow chart of the operations 230 and 240 which are further carried out in method 200 in order to determine/estimate whether the EM field sensed by the vector sensor suffers from interference effects, and, in case it does not, determine/estimate the DOA and possibly SOP of the sensed EM field.

In operation 230 the matching score $BF_i$ between the measured parametric EM field data $\langle \vec{X} \rangle$ and the reference parametric EM field data $\vec{A}_i$ of one or more of the reference data sets $\{DS_i\}$ are determined and one or more data sets whose matching scores $BF_i$ satisfy a certain threshold condition TH are selected as candidates for representing the sensed/measured EM field $\langle \vec{X} \rangle$. In various embodiments of the present invention operation 230 may include the following:

Carrying out operation 231 for providing one or more reference datasets for calculating their matching scores with the measured parametric EM field data $\langle \vec{X} \rangle$. This operation may be performed by the dataset looper/estimator module 131 in the manner described above.

Carrying out operation 232 for computing the matching scores between the one or more reference datasets and the measured parametric EM field data $\langle \vec{X} \rangle$. This operation may be performed by the matching score calculator module 132 in the manner described above.

As indicated above, in some embodiments the matching score $BF_i$ may be obtained by computing the inner product (generalized or simple inner product) and/or the correlation (in case A and X are functions of time) between the measured parametric EM field data $\langle \vec{X} \rangle$ and the reference parametric EM field data $\vec{A}_i$.

For instance, generally the matching score a simple inner product, such as that exemplified in optional operation 232.2 may be computed as follows:

$BF_i(\theta,\phi,\gamma,\tau) = \vec{A}_i^H \cdot \langle \vec{X} \rangle$ where here $\vec{A}_i^H$ is the Hermitian (i.e. transpose conjugate) of the reference parametric EM field data vector $\vec{A}_i$ (e.g. for real values, the Hermitian conjugate being just the transposed).

Alternatively or additionally, in some embodiments a generalized inner product is computed, as shown in 232.4 by taking computing the covariance matrix $\langle \vec{X} \rangle \langle \vec{X} \rangle^H$ of the measured parametric EM field data $\langle \vec{X} \rangle$ and multiplying the reference parametric EM field data vector $\vec{A}_i$ from one side and by its Hermitian conjugate $\vec{A}_i^H$ from the other side. For example, as follows:

$$BF_i(\theta, \phi, \gamma, \tau) = \frac{\vec{A}_i^H \langle \vec{X} \rangle \langle \vec{X} \rangle^H \vec{A}_i}{\vec{A}^H \vec{A}}$$

In this example also the normalization coefficient is $$\frac{1}{\vec{A}^H \vec{A}}$$

multiplied, however this may not be needed in case the reference parametric EM field data vector $\vec{A}_i$ in the reference data are already normalized.

To this end, for example an estimate of the steering parameters $\theta,\phi,\gamma,\tau$ of the measured parametric EM field $\langle \vec{X} \rangle$ based on the reference data may be obtained by the following computation:

$$\hat{\theta}, \hat{\phi}, \hat{\gamma}, \hat{\tau} = \underset{\theta,\phi,\gamma,\tau}{\operatorname{argmax}} \frac{\vec{A}_{(\theta,\phi,\gamma,\tau)}^H Q \vec{A}_{(\theta,\phi,\gamma,\tau)}}{\vec{A}_{(\theta,\phi,\gamma,\tau)}^H \vec{A}_{(\theta,\phi,\gamma,\tau)}}$$

where Q is the covariance matrix of the measurements (indicated above) and $\vec{A}_{(\theta,\phi,\gamma,\tau)}$ is the reference parametric EM field data vector $\vec{A}_i$ whereby instead of the index i, it is presented as spanned over the four dimensions of the steering parameters $\theta,\phi,\gamma,\tau$, and $\vec{A}_{(\theta,\phi,\gamma,\tau)}^H$ is its Hermitian.

Yet, alternatively or additionally, in some embodiments, particularly when operating in the temporal domain in which both the measured parametric EM field data $\langle \vec{X} \rangle$ and multiplying the reference parametric EM field data vector $\vec{A}_i$ are functions of time, matching score $BF_i$ may be computed as the maximal correlation (for any $\Delta t$) between those temporal vector functions, as shown in 232.6, and as follows:

$BF_i(\theta,\phi,\gamma,\tau) = \operatorname{Corr}(\vec{A}_i^H(t), \langle \vec{X} \rangle(t+\Delta t))$ It should be understood that the present invention is not limited by the specific technique by which the matching score is computed and that generally, as would be readily appreciated by those versed in the art, other computations/equations may be used to determine a match/matching score between the measured parametric EM field data $\langle \vec{X} \rangle$ and the reference parametric EM field data vector $\vec{A}_i$.

It should be noted that in cases/embodiments where both the measured parametric EM field data $\langle \vec{X} \rangle$ and the reference parametric EM field data vector $\vec{A}_i$ are normalized (e.g. according to operations 219 and 221 respectively), the maximal possible value of the matching score $BF_i$ is unity. The matching score $BF_i$ reaches its maximum (e.g. unity) when the steering vector parameters $\vec{S}_i$ corresponding to the reference parametric EM field data vector $\vec{A}_i$ is of the same as the direction and polarization of the measured parametric EM field data $\langle \vec{X} \rangle$.

Operation 234 may be carried out by determining a threshold condition TH for determining candidate datasets based on the matching scores computed in 232. The threshold condition TH may be a predetermined (a priori set condition), or dynamically determined condition (e.g. which may be set to allow only up to a limited number of candidate datasets). Generally, the threshold condition TH may be set in order to optimize a ratio between false positive candidates (false alarms—these are candidate data sets whose matching scores are above the threshold, but yet whose steering vector parameters $\vec{S}_i$ does not actually represent the DOA and/or SOP of the measured EM field) and false negatives (that is miss-identification as candidate of data set whose steering vector parameters $\vec{S}_i$ does actually represent the DOA and/or SOP of the measured EM field). The considerations of selection of the threshold condition TH are discussed in more detail below with reference to FIG. 4.

In operation 236 (e.g. which may be performed by the match analyzer module 136) the candidate data-sets (or steering vectors' parameters) are determined. In case the matching score $BF_i$ between the measured parametric EM field data $\langle \vec{X} \rangle$ and the reference parametric EM field data $\vec{A}_i$ of a certain reference data set $DS_i$ complies with the threshold condition TH, then it is estimated that the measured parametric EM field data $\langle \vec{X} \rangle$ may correspond to an EM wavefront propagating with the properties (DOA and/or SOP) of the steering vector parameters $\vec{S}_i$ of the certain reference data set. Accordingly, such a certain reference data set $DS_i$ is selected as candidate.

In operation 240, which may be performed for example by the—interference/steering estimator module 140 of system 100 includes determining whether the measured parametric EM field data $\langle \vec{X} \rangle$ represents the existence/sensing of interference conditions, and in case it does not, determining/estimating the steering parameters (DOA and/or SOP) of the measured parametric EM field $\langle \vec{X} \rangle$.

As shown in 242, in case that no candidate data-sets are identified in 236, the measured parametric EM field data $\langle \vec{X} \rangle$ may be considered not to be matching to any one single reference parametric EM field $\vec{A}_i$ and thus its DOA and/or SOP cannot be associated with any particular steering vector parameters. This is the case where none of the matching scores $BF_i$ between the measured parametric EM field data $\langle \vec{X} \rangle$ and any of the reference parametric EM field data $\vec{A}_i$ of reference data sets $\{DS_i\}$ comply with the certain threshold condition. In this case, it is determined (e.g. under the assumption that the reference data includes all the relevant reference parametric EM fields $\{\vec{A}_i\}$ of interest) that the measured parametric EM field data $\langle \vec{X} \rangle$ cannot be associated with a certain single wavefront (at least none which are included/approximated in the reference data), and therefore it is determined that the measured parametric EM field data $\langle \vec{X} \rangle$ was obtained due to the sensing/measurement of harsh interference/multipath conditions by the vector sensor 10. Therefore, in this case, the result of method 200 might be that the measured parametric EM field data $\langle \vec{X} \rangle$ was sensed under the interfering conditions (e.g. it represents interfering EM fields). However, optionally in some embodiments (as shown in operation 243) in such cases the operations of method 200 are repeated for an additional one or more times (e.g. until a measured parametric EM field data $\langle \vec{X} \rangle$ not associated with interference conditions, is obtained).

As shown in 242, in case that no candidate data-sets are identified in 236 (or the candidate(s) identified in 236 were subsequently further filtered out in operation 241 described below—e.g. by the SOP filter 141), the measured parametric EM field data $\langle \vec{X} \rangle$ may be considered not to be matching to any one single reference parametric EM field for which particular steering vector parameters exists. This is the case where none of the matching scores $BF_i$ between the measured parametric EM field data $\langle \vec{X} \rangle$ and any of the reference parametric EM field data $\vec{A}_i$ of reference data sets $\{DS_i\}$ comply with the certain threshold condition, determining that the measured parametric EM field data $\langle \vec{X} \rangle$ cannot be associated with a certain single wavefront due to the presence of harsh interference/multipath conditions. Therefore, in this case, the result of method 200 is that the measured parametric EM field data $\langle \vec{X} \rangle$ was sensed under the interfering conditions (e.g. it represents interfering EM fields). In this case, optionally operation 243 is further carried out to repeat the method 200 for an additional one or more times, during which interference conditions might not exist.

Optionally, in some embodiments, operation 242 includes carrying out the optional operation 241 to further filter the candidate data sets obtained in 236, based on prior knowledge about properties of the expected waveform. This may be performed for instance as explained above with reference to module 141.

Optional operation 244, may be carried out in case single candidate datasets $DS_i$ is found/obtained in operation 236 or after the optional SOP filtration of operation 241. In this case the single candidate dataset $DS_i$ is that for which $\vec{A}_i$ matches $\langle \vec{X} \rangle$). Accordingly, the steering vector parameters $\vec{S}_i$ of the single candidate datasets $DS_i$ dataset is determined to provide an accurate estimate of the DOA and/or SOP of the measured parametric EM field data $\langle \vec{X} \rangle$.

Optional operation 246, may be carried out in case multiple candidate datasets are found/obtained in operation 236 or after the optional SOP filtration of operation 241. In this case, the reference parametric EM field data $\vec{A}_i$ of all candidates seem to match the measured parametric EM field data $\langle \vec{X} \rangle$, and thus the steering vector parameters $\vec{S}_i$ of any of those candidate datasets may be representative of the DOA/SOP properties of the measured parametric EM field $\langle \vec{X} \rangle$. Accordingly, there may be several options for determining the DOA and/or SOP of the measured parametric EM field data $\langle \vec{X} \rangle$, as follows:

In some embodiments/implementations, the method 200 may be repeated for an additional one or more times (e.g. as in operation 243) until only a single candidate data set is found.

In some embodiments/implementations, the threshold condition/bar TH is raised (e.g. operations 234 and 236 described above are repeated for the candidate data sets, but only with stricter threshold conditions). In this way, one or more of the candidate data sets may be eliminated to remain with a single candidate dataset, which is then handled according to operation 244.

In some embodiments/implementations, the correspondence between one of the candidate datasets and the measured parametric EM field data $\langle \vec{X} \rangle$ is resolved by additional systems such as a phased array antenna system and/or beamforming system having high spatial resolution. Indeed, in cases where there are several candidate datasets, often their DOAs are substantially different. Therefore, beam forming arrays/phased-array systems having high spatial resolution may be used to resolve which of the candidates actually match the measured EM field.

Turning back to FIG. 2C, it should be noted that the sub-method 220 which is used for providing the reference data as described above, may in some embodiments not only be incorporated in method 200, but also may be implemented as a standalone method 220 for computing reference data for use in determining the DOA and SOP properties of an EM field sensed by a vector sensor. The reference data computed in this way may then be stored in the reference data repository, 120, and may be later on used/provided in the scope of operation method 200.

Figure 4:
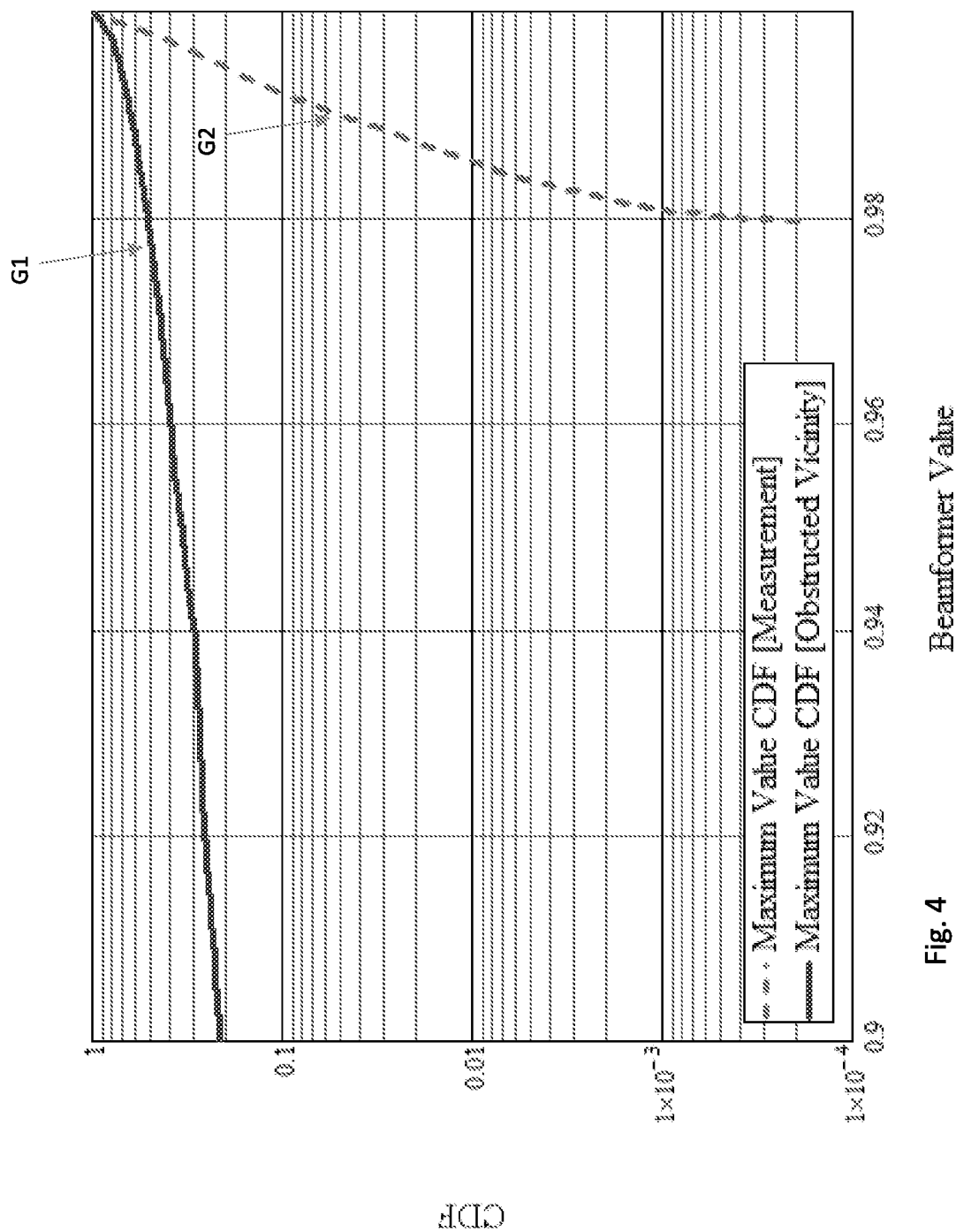
FIG. 4 is a graphical illustration showing the statistics (commutative distribution function) of highest matching scores obtained according to the technique of the present invention for multipath (interfered) waveforms (e.g. yielding a plurality of wavefronts), and single path (non-interfered waveforms (e.g. having a single wavefront).

Reference is made to FIG. 4, which is a graphical illustration of the statistics (commutative distribution function) of matching scores obtained according to the technique of the present invention for the vector-sensor measurements <X> of waveforms of two cases: graph G1 shows the commutative distribution function of the maximal values of the matching scores calculated according to the technique of the present invention for the measured parametric EM fields <X> of respective waveforms in a first population of waveforms each associated with two or more wavefronts; and graph G2 shows the commutative distribution function of the maximal values of the matching scores calculated according to the technique of the present invention for the measured parametric EM fields <X> of respective waveforms in a second population of waveforms, each associated with a single wavefront. In other words, graph G1 shows the statistics of the matching scores obtained from a population of different signal measurements that are taken under obstructed conditions (e.g. multipath/interference conditions which may result from obstructions such as buildings and/or other reflecting/scattering objects), while graph G2 pertains to the statistics of the highest value matching scores obtained for a population of different signal measurements taken in unobstructed conditions (namely when no multipath/interference conditions exist).

Generally, the matching score reaches its maximum (e.g. unity) when the steering vector parameters of a certain reference data set is of the same direction and polarization i.e. $\vec{A}=\vec{A}(\theta_o,\phi_o,\gamma_o,\tau_o)$ as the measured EM field, while the measured EM field is associated with a single wavefront. Indeed, in real life scenarios, the maximal matching score may degrade from unity. Nevertheless, actual values were found to be distributed in close vicinity to unity for a single wavefront propagating to the sensor, as shown in the dashed graph G2 in FIG. 4. However, as shown in graph G1, when observing the commutative distribution function, which resulted in obstructed vicinity (interference/multipath conditions), namely for sensed/measured waveforms having multiple wavefronts, the probability of low maximal values of the matching scores is significantly increased, and the probability to obtain high matching scores in this case becomes substantially low or negligible. To this end, the graphical illustration in FIG. 4 illustrates statistically that the technique of the present invention provides reliable discrimination between waveforms which are sensed/measured under obstructed/interference conditions and unobstructed/non-interference conditions. Or, in other words, it facilitates discrimination between the sensing of waveforms associated with multipath and non-multipath conditions. It should be noted that the threshold TH set/provided in operation 234 (e.g. by the threshold provider module 134) may be adjusted accordingly (e.g. based on such statistics or similar statistics), in order to obtain such discrimination between multipath conditions and non-multipath conditions, with desired reliability (namely to optimize the desired probability for false positive and false negative errors in such discrimination (also known as type I and type II statistical errors or alpha and beta errors). Considering the hypothesis that the sensed/measured waveform is subjected to multipath/interference (namely has multiple wavefronts), the probability of false positive error (type I) represents the probability that the highest matching score computed according to the technique for the present invention was below the threshold, thereby indicating that the sensed waveform has multiple wavefronts, while in practice it had only a single wavefront (no-multipath). In the same way, the probability of false negative error (type II) represents the probability that the highest matching score computed according to the technique of the present invention was above the threshold, thereby indicating that the sensed waveform has a single wavefront, while in practice it had multiple wavefronts (multipaths). Thus, the threshold conditions provided in 234, may be adjusted in accordance with the particular needs of a certain task so as to adjust/balance the probabilities for type I and type II errors in accordance with the statistics of the technique of the present invention (e.g. such as that exemplified in the non-limiting example of FIG. 4, or other statistics, which may be further adjusted/computed as per particular embodiments/implementations of the present invention).

For example, considering the particular example of FIG. 4, it may be realized that in this case assigning the threshold value to be 0.998 more than 80% of the obstructed/multipath population is filtered out (i.e. the type II error is 20%) while more than 50% of the unobstructed/single-path population (i.e. the type I error is 50%) is still valid. Accordingly, the threshold value TH can be tuned a priori or in real time in order for example to optimize the false alarm rate (type II error, obstructed population is considered to be unobstructed).

In this regard, it should be understood that further improvements in the above values of statistical errors are achieved according to the technique of the present invention by carrying out one or more of the following as described above:

1. Repeating method 200 several times (for several time frames/periods) to confirm that the measured signal indeed matches a certain particular data-set/steering vector parameters (DOA and SOP) with improved probability and reduced statistical errors;
2. Further filtration of allegeable matching candidate data sets, based on prior knowledge about the expected (e.g. roughly estimated) properties (e.g. DOA and/or SOP) of the waveform which is sensed/received (as for example described in relation to operation 241 above and performed by the SOP filter 141 described above).
3. A priori filtration of the data-sets, for which the matching score will be calculated in the first place based on prior knowledge about the expected (e.g. roughly estimated) properties (e.g. DOA and/or SOP) of the waveform which is sensed/received. Accordingly, the matching scores in this case will be only calculated for those data sets whose steering vectors' parameters match the expected properties of the sensed waveform, thereby reducing the probability of obtaining high matching scores for irrelevant data sets, and, in turn improving (reducing) the statistical errors indicated above.

The invention claimed is:

1. A method for determining properties of an electromagnetic (EM) waveform, the method comprising:
 providing measured parametric EM field data indicative of measured vector components of electric and magnetic fields of an EM waveform measured in at least one instance of time;
 providing reference data indicative of a plurality of reference data sets, each data set comprising: reference steering vector parameters indicative of a certain respective direction of arrival (DOA), and corresponding parametric EM field reference data including reference vector components of an electric and magnetic field pertaining to a wavefront propagating with the DOA of the corresponding reference steering vector parameters;

providing a certain threshold condition;

computing one or more matching scores, each matching score indicating a level of matching between the measured parametric EM field data and the parametric EM field reference data of a specific reference data set of the plurality of reference data sets;

determining which of said one or more matching scores complies with said certain threshold condition, and designating that said measured parametric EM field data corresponds to said EM waveform having a single EM wavefront if a single one of said one or more matching scores complies with said certain threshold condition, thereby providing accurate estimate of a DOA of the EM waveform for location/geolocation finding of a signal source of the EM waveform.

2. The method of claim 1, comprising, upon said designating that said EM waveform has a single EM wavefront, estimating a DOA of said single EM wavefront based on the reference steering vector parameters of said certain reference data set whose matching score complies with said certain threshold condition.

3. The method of claim 1, wherein said determining comprises one or more of:

designating that said measured parametric EM field data corresponds to the EM field measured under interference conditions if none of said one or more matching scores complies with said certain threshold condition; and/or, applying further processing to a group of candidate reference data sets of said plurality of reference data sets, and/or repeating said providing measured parametric EM field data, if a plurality of said matching scores, corresponding to said group of candidate reference data sets, comply with said certain threshold condition.

4. The method of claim 3, wherein said providing comprises providing predetermined data of properties of said EM waveform;

wherein said further processing comprises determining which of said candidate reference data sets comply with said predetermined data, and filtering out from said group those candidate reference data sets which do not comply with said predetermined data.

5. The method of claim 4, wherein said predetermined data pertains to a state of polarization of a source of said EM waveform, thereby enabling discriminating between single path waveforms and multipath waveforms which are associated with reflection and/or scattering from objects which are in relative vicinity to said source, as compared to a distance of the objects from the vector sensor.

6. The method of claim 1, wherein the measured parametric EM field data is indicative of nominal vector components of said electric and magnetic fields obtained from a plurality of measurements of said electric and magnetic fields taken in a plurality of time instances.

7. The method of claim 6, wherein said nominal vector components of said electric and magnetic fields are obtained by processing said plurality of measurements of said electric and magnetic fields which are taken in a plurality of time instances and wherein at least one of the following:

said processing comprises averaging of said plurality of measurements; and/or said processing comprises coherent integration of said plurality of measurements;

said measured vector components are obtained from a sensor being under movement conditions.

8. The method of claim 6, wherein said measured parametric EM field data pertains to a certain frequency and wherein the method comprises processing said plurality of measurements of said electric and magnetic fields taken in the plurality of time instances, to determine frequency contents of the measured electric and magnetic fields in at least said certain frequency such that said nominal vector components pertain to amplitudes of components of said electric and magnetic fields associated with said certain frequency.

9. The method of claim 6, wherein said nominal vector components of the electric and magnetic fields pertain to electric and magnetic fields of a certain temporal form; and wherein said plurality of reference data sets are associated with one or more predetermined temporal forms.

10. The method of claim 9, wherein at least one of the following:

said certain temporal form and said one or more predetermined temporal forms are pulse forms of predetermined widths; and/or the matching score between the measured parametric EM field data and the parametric EM field reference data of a certain reference data set is determined by computing a correlation between normalized values of the measured parametric EM field data and the parametric EM field reference data of the certain reference data set.

11. The method of claim 1, wherein said computing comprises computing an inner product between the measured parametric EM field data and the parametric EM field reference data of the certain reference data set by at least one of the following:

computing said inner product between normalized values of the measured parametric EM field data and the parametric EM field reference data of the certain reference data set; and computing said inner product as a generalized inner product computed based on a covariance of said measured parametric EM field data and said the parametric EM field reference data of the certain reference data set.

12. The method of claim 1, wherein the reference steering vector parameters of at least one reference data set of said reference data, are indicative of at least one of the following:

a two dimensional direction of arrival (DOA) of the corresponding parametric EM field reference data; and wherein determining compliance of the matching score with said certain threshold condition thereby provides an estimate of two dimensional direction of arrival (DOA) of a wavefront associated with said measured parametric EM field;

polarization parameters of the corresponding parametric EM field reference data; and wherein determining compliance of the matching score with said certain threshold condition thereby provides an estimate of the direction of arrival (DOA) of a wavefront associated with said measured parametric EM field and polarized with said polarization parameters.

13. The method of claim 1, wherein the measured parametric EM field is obtained by at least one parametric EM field sensing device comprising three or more antenna elements arranged to span sensing of at least one of an electric field or a magnetic field in 3D coordinates.

14. The method of claim 1, wherein said reference data is adjusted to a certain location at which the vector sensor is located so as to compensate for warping effect of objects in the vicinity of said location on the measured parametric EM field sensed at said location.

15. A system for determining properties of an electromagnetic (EM) waveform, the system comprising:
   a measurements' preprocessor connectable to a vector sensor and adapted to provide measured parametric EM field data indicative of measured vector components of electric and magnetic fields of the EM waveform measured by said vector sensor in at least one instance of time;
   a reference data provider connectable to a reference data repository comprising reference data and adapted to provide a plurality of reference data sets, each data set comprising: reference steering vector parameters indicative of a certain respective direction of arrival (DOA), and corresponding parametric EM field reference data including reference vector components of an electric and magnetic field pertaining to a wavefront propagating with the DOA of the corresponding reference steering vector parameters;
   a comparator executable by a processor to determine matching scores between the measured parametric EM field data and the parametric EM field reference data of one or more of the reference data sets; and
   an interference estimator executable by the processor to determine which of said matching scores complies with a certain threshold condition, and designate that said measured parametric EM field data corresponds to the EM waveform having a single wavefront if a single one or said one or more matching scores complies with said certain threshold condition, thereby providing accurate estimate of a DOA of the EM waveform for location/geolocation finding of a signal source of the EM waveform.

16. The system of claim 15, comprising a DOA/SOP estimator executable by the processor to execute a DOA of said single EM wavefront based on the reference steering vector parameters of said certain reference data set whose matching score complies with said certain threshold condition.

17. The system of claim 15, wherein the measurements preprocessor is adapted to obtain a plurality of measurements of said electric and magnetic fields taken in a plurality of time instances and for processing said plurality of measurements to obtain said measured parametric EM field data as indicative of nominal vector components of said electric and magnetic fields.

18. The system of claim 17, wherein said measured vector components are obtained from a sensor being under movement conditions.

19. The system of claim 17, wherein said nominal vector components of the electric and magnetic fields pertain to electric and magnetic fields of a certain frequency; and wherein said plurality of reference data sets are frequency specific reference data sets whose parametric EM field reference data pertain to said certain frequency.

20. The system of claim 17, wherein said nominal vector components of the electric and magnetic fields pertain to electric and magnetic fields of a certain temporal form; and wherein said plurality of reference data sets are associated with one or more predetermined temporal forms; and
   wherein said comparator is executable by the processor to determine the respective matching scores between the measured parametric EM field data and the parametric EM field reference data of respective reference data sets by computing correlations between normalized values of the measured parametric EM field data and the corresponding parametric EM field reference data of the respective reference data sets.

21. The system of claim 15, wherein said comparator is executable by the processor to determine said matching scores between the measured parametric EM field data and the reference data sets of the by respectively computing inner products between the measured parametric EM field data and the corresponding parametric EM field reference data of the respective reference data sets; and wherein at least one of the following:
   said inner products are computed between normalized values of the measured parametric EM field data and the corresponding parametric EM field reference data of the respective reference data sets; and
   said inner products are computed as generalized inner products computed based on covariance of said measured parametric EM field data and the corresponding parametric EM field reference data of the respective reference data sets.

22. The system of claim 15, wherein the reference steering vector parameters of at least one reference data set of said reference data, is indicative of one or more of the following:
   direction of arrival (DOA) of the corresponding parametric EM field reference data; and/or
   polarization parameters of the corresponding parametric EM field reference data.

23. The system of claim 15, comprising or connected to a parametric EM field sensing device and wherein at least one of the following:
   said reference data is specific to a type of said parametric EM field sensing device, and includes compensation for warping and/or distortion effects of said EM field sensing device itself on the measured parametric EM field sensed by the EM field sensing device; and/or
   said parametric EM field sensing device is a single parametric EM field sensing device located at a certain location or platform and wherein said reference data is adjusted according to said certain location or platform so as to compensate for warping effect of objects in the vicinity of said certain location or platform.

24. The system according to claim 15, wherein said interference estimator is executable by the processor to:
   designate that said measured parametric EM field data corresponds to the EM field measured under interference conditions if none of said one or more matching scores complies with said certain threshold condition; and/or wherein said interference estimator comprises a filter executable by the processor to further process a group of candidate reference data sets of said plurality of reference data sets to filter out one or more candidate reference data sets from said group, if a plurality of said matching scores corresponding to said group of candidate reference data sets comply with said certain threshold condition.

25. The system of claim 24, wherein said reference data provider is configured to receive a-priori data indicative of a state of polarization of a source of said EM waveform; and
   wherein said filter is executable by the processor to filter out those candidate reference data sets whose respective reference steering vectors' parameters do not comply with said a-priori data.

* * * * *